(12) United States Patent
O'Shaughnessy et al.

(10) Patent No.: US 7,869,133 B2
(45) Date of Patent: Jan. 11, 2011

(54) ANAMORPHIC OPTICAL SYSTEM PROVIDING A HIGHLY POLARIZED LASER OUTPUT

(76) Inventors: John O'Shaughnessy, 4906 Loma Laguna Dr., Carlsbad, CA (US) 92008; David E. Hargis, 12697 Calle de la Siena, San Diego, CA (US) 92130; Eric B. Takeuchi, 10994 Shy Bird La., San Diego, CA (US) 92128; Marc L. Shaffer, 2060 N. Nutmeg, Escondido, CA (US) 92026

( * ) Notice: Subject to any disclaimer, the term of this patent is extended or adjusted under 35 U.S.C. 154(b) by 0 days.

(21) Appl. No.: 12/686,178

(22) Filed: Jan. 12, 2010

(65) Prior Publication Data

US 2010/0254022 A1 Oct. 7, 2010

Related U.S. Application Data

(62) Division of application No. 11/451,623, filed on Jun. 12, 2006, now Pat. No. 7,646,546.

(60) Provisional application No. 60/689,619, filed on Jun. 10, 2005, provisional application No. 60/691,271, filed on Jun. 15, 2005, provisional application No. 60/763,497, filed on Jan. 30, 2006.

(51) Int. Cl.
*G02B 13/08* (2006.01)
*G02B 27/10* (2006.01)

(52) U.S. Cl. .................................... 359/668; 359/625
(58) Field of Classification Search ......... 359/618–626, 359/668, 669, 670, 671
See application file for complete search history.

(56) References Cited

U.S. PATENT DOCUMENTS 4,609,258 A * 9/1986 Adachi et al. ............... 359/669
7,554,650 B2 * 6/2009 Saito et al. .................. 359/668

* cited by examiner

*Primary Examiner*—Alicia M Harrington
(74) *Attorney, Agent, or Firm*—Knobbe Martens Olson & Bear LLP

(57) ABSTRACT

Apparatus and methods are disclosed for transforming a laser beam to a polarized shaped beam in, for example, a frequency converted laser system. In one embodiment, an anamorphic optical system includes a first prism and a second prism that can be configured to form a Brewster telescope, the first prism and second prism each having an input surface and an exit surface, and wherein at least one surface of the input or exit surfaces are coated with a polarization selective coating. The optical system can include an adjustment system configured to change the position of one or both of the first prism and the second prism to adjust the transformation of the shape of the laser beam. In some embodiments of the optical system, a configuration of the first prism, the second prism, and the polarization selective coating produce a laser beam having a polarization ratio of about 100:1 or higher.

20 Claims, 22 Drawing Sheets

Diode Laser profile

| S-polarized Transmission | | |
|---|---|---|
| Sample : i30505121 HXP488 | | |
| Comment : 1" BK-7 wit., outer row, 50 deg AOI, S-pol | | |
| NO. | WL (nm) | Data (%T) |
| 1 | 500 | 74.49 |
| 2 | 498 | 57.87 |
| 3 | 496 | 33.72 |
| 4 | 494 | 15.24 |
| 5 | 492 | 5.74 |
| 6 | 490 | 2.20 |
| 7 | 488 | 0.94 |
| 8 | 486 | 0.49 |
| 9 | 484 | 0.29 |
| 10 | 482 | 0.19 |
| 11 | 480 | 0.13 |
| 12 | 478 | 0.11 |
| 13 | 476 | 0.09 |
| 14 | 474 | 0.07 |
| 15 | 472 | 0.06 |
| 16 | 470 | 0.04 |

FIG. 17

| P-polarized Transmission | | |
|---|---|---|
| Sample | : i30505121 HXP488 | |
| Comment | : 1" BK-7 wit., outer row, 50 deg AOI, P-pol | |
| NO. | WL (nm) | Data (%T) |
| 1 | 500 | 95.53 |
| 2 | 498 | 95.13 |
| 3 | 496 | 94.80 |
| 4 | 494 | 94.94 |
| 5 | 492 | 95.58 |
| 6 | 490 | 96.36 |
| 7 | 488 | 97.05 |
| 8 | 486 | 97.50 |
| 9 | 484 | 97.74 |
| 10 | 482 | 97.49 |
| 11 | 480 | 95.29 |
| 12 | 478 | 88.83 |
| 13 | 476 | 76.13 |
| 14 | 474 | 58.12 |
| 15 | 472 | 38.89 |
| 16 | 470 | 22.96 |
| 17 | 468 | 12.43 |
| 18 | 466 | 6.47 |
| 19 | 464 | 3.45 |
| 20 | 462 | 1.98 |
| 21 | 460 | 1.22 |

FIG. 18

ANAMORPHIC OPTICAL SYSTEM PROVIDING A HIGHLY POLARIZED LASER OUTPUT

RELATED APPLICATIONS

This application is a divisional of U.S. application Ser. No. 11/451,623, filed Jun. 12, 2006, now U.S. Pat. No. 7,646,546, which claims the benefit of U.S. Provisional Application No. 60/689,619, filed Jun. 10, 2005, U.S. Provisional Application No. 60/691,271, filed Jun. 15, 2005, and U.S. Provisional Application No. 60/763,497, filed Jan. 30, 2006, each of which is assigned to the assignee hereof and hereby incorporated by reference in its entirety.

BACKGROUND

1. Field

This invention relates to lasers and particularly to anamorphic optical systems for use with lasers that output elliptical beams. In particular, various embodiments of this invention relate to anamorphic optical systems that receive an elliptical beam from a laser diode and transform it into an approximately circular output beam that is polarized.

2. Background

The use of diode laser systems for scientific, commercial, and home applications is becoming widespread due to their low cost, efficient operation, and recent increases in output power. For many such applications, diode lasers are viable replacements for larger and more expensive gas lasers. However, diode lasers can have certain technical problems regarding beam quality (e.g., beam shape and polarization) that should be addressed for their most effective utilization. Many laser applications are best performed with a polarized laser beam having a circular cross-section, rather than an un-polarized elliptically-shaped laser beam which is produced by a typical diode laser. Some laser applications require a high degree of beam polarization, for example, exceeding a 500:1 polarization ratio. An anamorphic optical system can be provided to transform the elliptical laser beam into a more circular beam. However, conventional anamorphic optical systems do not produce a polarized laser beam. Instead, beam polarization is accomplished using one or more additional optical polarizing elements, which can cause beam alignment, power loss, beam quality degradation, cost and size issues. Accordingly, the need exists for an anamorphic optical system that overcomes these issues and satisfies technical requirements regarding beam quality.

SUMMARY

Each of the inventive apparatuses and methods described herein has several aspects, no single one of which is solely responsible for its desirable attributes. Without limiting the scope of this invention, its more prominent features will now be discussed briefly. After considering this discussion, and particularly after reading the section entitled "Detailed Description" one will understand how the features of this invention provides improvements for anamorphic optical systems for use with lasers that output elliptical beams.

Inventive aspects described herein relate to using, in one embodiment, a frequency converted laser system that includes a waveguide comprising at least one nonlinear material, said waveguide being configured to receive an input laser beam of a first frequency and emit a non-circular shaped laser beam having a second frequency, the second frequency different than the first frequency, and an anamorphic optical system configured to input a laser beam emitted from said waveguide, said anamorphic optical system comprising a first prism and a second prism configured to provide an anamorphic change to the shape of the input beam, the first prism and second prism each comprising an input surface and an exit surface, wherein at least one of said input or exit surfaces of the first or second prisms is coated with a polarization selective coating, said anamorphic optical system being configured to transform the input laser beam from the waveguide into a polarized output laser beam with an anamorphically changed beam shape. The system can further include a collimator positioned to receive the laser beam emitted from the waveguide, the collimator configured to collimate the laser beam and provide the collimated waveguide beam to the anamorphic optical system. The system can further include a fiber Bragg grating stabilized laser configured to provide the laser beam input to the waveguide, or an external cavity diode laser configured to provide the laser beam input to the waveguide. In some embodiments, the system can further include a beam splitter positioned to receive the polarized output beam from said anamorphic optical system, said beam splitter configured to split off a portion of the output beam so as to provide a polarized optical signal, and a control system positioned to receive the polarized optical signal from said beam splitter, said control system configured to provide feedback to optimize the control of the laser system based on the optical signal. In some embodiments the input surface of at least one of the first prism and the second prism are positioned such that an angle of incidence of the input laser beam is within a range of about plus or minus two degrees of Brewster's angle. In some embodiments, the frequency converted laser system the polarization selective coating is configured to reflect about 98% or more of a s-polarization component and transmit about 98% or more of a p-polarization component. In some embodiments, the polarization selective coating is configured to reflect about 98% or more of a s-polarization component and transmit about 98% or more of a p-polarization component at wavelengths of between about 485 nm and 492 nm. In some embodiments, the polarization selective coating on the coated input surface is configured to transmit about 0.04% or less of a s-polarization component and transmit about 99.4% or more of a p-polarization component at a wavelength of about 488 nm. The waveguide of the frequency converted laser system can be configured to emit light having a wavelength of between about 487 nm and about 489 nm when the input laser beam has a wavelength of between about 974 nm and about 978 nm. In some embodiments, the waveguide is configured to emit light having a wavelength of about 488 nm when the input laser beam has a wavelength of about 976 nm. And in some embodiments, the anamorphic optical system is configured to transform the input beam to an output beam having a polarization ratio of about 100:1 or higher.

In another embodiment, a frequency converted laser system includes a waveguide comprising at least one nonlinear material, said waveguide being configured to receive first and second input laser beams and emit a non-circular shaped laser beam having a frequency different than either said first or second input laser beams, and an anamorphic optical system configured to input said non-circular shaped laser beam emitted from said waveguide, the anamorphic optical system comprising a first prism and a second prism configured to provide an anamorphic change to the shape of the beam input into the anamorphic optical system, the first prism and second prism each comprising an input surface and an exit surface, wherein at least one of the input or exit surfaces of the first or second prisms is coated with a polarization selective coating, the anamorphic optical system being configured to transform the input non-circular shaped laser beam into a polarized output laser beam with an anamorphically changed beam shape. In some embodiments, the first and second input laser beams have the same frequency, while the first and second input laser beams have the different frequencies.

In another embodiment, an anamorphic optical system for transforming an input elliptical shaped collimated laser beam from a diode laser into a polarized, anamorphically changed laser beam, comprising a first prism and a second prism configured to provide an anamorphic change to the shape of the input beam, the first prism and second prism each having an input surface and an exit surface, and wherein at least one of the input or exit surfaces of the first or second prisms is coated with a polarization selective coating.

In another embodiment, an optical system for transforming a non-circular laser beam from a laser to a polarized differently-shaped laser symmetric beam, includes a first optical component comprising a first input surface for receiving a beam from a laser and a first exit surface through which the beam is emitted, and a second optical component having a second input surface aligned to receive the beam emitted from the first optical component and a second exit surface through which the beam is emitted, where the first and second optical components are structured to transform a lateral dimension of the beam as it propagates through the first and second optical components so that the shape of the beam emitted from the second optical component is more circularly symmetrical than the input beam, and where at least one of the input and output surfaces of the first or second optical components is coated with a polarization selective coating.

In another embodiment, a method of transforming a laser beam in a frequency converted laser system to a highly-polarized beam of a different beam shape includes providing an input laser beam to an input surface of a first prism, propagating the laser beam through the first prism, directing the laser beam from the first prism to an input surface of a second prism, propagating the laser beam through the second prism, transforming the shape of the input laser beam as it propagates through the first prism and the second prism to form an exit laser beam having a beam shape different than the shape of the input laser beam, polarizing the laser beam, and emitting the exit laser beam from the second prism, wherein the exit laser beam has a polarization ratio of more than about 100:1 upon exiting the second prism.

In another embodiment, an apparatus for transforming an elliptical-shaped laser beam to a polarized substantially circular shaped beam includes means for introducing a first amount of prismatic deviation along a first direction of said elliptical shaped input laser beam, means for introducing a second amount of prismatic deviation along said first direction of the input laser beam, and means for polarizing the input laser beam such that said laser beam has a polarization ratio of greater than 100:1 said means for polarizing being disposed on said first or second prismatic deviation introducing means, where the first and second amount of prismatic deviation transforms a lateral dimension of the input laser beam along said first direction to form an output laser beam that is more circularly symmetrical than the elliptical shaped input laser beam.

In another embodiment, a frequency converted laser system, includes a laser configured to emit a laser beam, a waveguide comprising a nonlinear material, said waveguide positioned to receive an emitted laser beam from said laser, said waveguide configured to emit an output laser beam having a frequency different than the laser beam received from said laser, a polarizer positioned to receive an output laser beam emitted by said frequency conversion component, said polarizer configured to polarize the received output beam and emit a highly polarized exit laser beam having a polarization ratio of at least 100:1, a beam splitter positioned to receive the highly polarized exit beam from said polarizing component, said beam splitter configured to reflect a portion of the exit beam so as to provide a highly polarized optical signal, and a control system positioned to receive the polarized optical signal from said beam splitter, said control system configured to provide feedback to optimize the control of the laser system based on the optical signal. In some embodiments, the control system controls the power output of said laser by regulating the current supplied to said laser based on the optical signal. In some embodiments, the control system controls the light output of the waveguide by adjusting the temperature of the waveguide.

BRIEF DESCRIPTION OF THE DRAWINGS

FIG. 17 is a table illustrating transmission percentages for an s-polarization component of a laser beam propagating through a polarization selective coating.

FIG. 18 is a table illustrating transmission percentages for a p-polarization component of a laser beam propagating through a polarization selective coating.

DETAILED DESCRIPTION

Figure 1A:
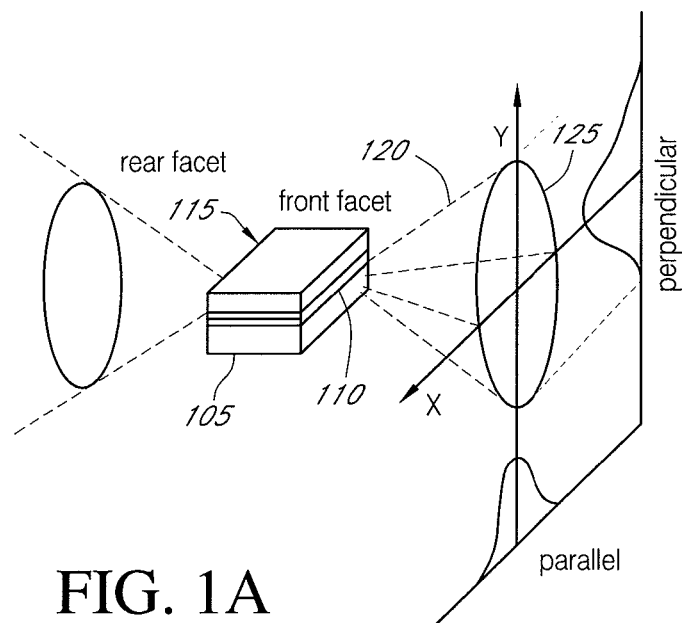
FIG. 1A is a diagram illustrating an example of a diode laser beam profile as it is emitted from the diode laser.

The following detailed description is directed to certain embodiments of the invention. However, the invention can be embodied in a multitude of different ways. Reference in this specification to "one embodiment" or "an embodiment" means that a particular feature, structure, or characteristic described in connection with the embodiment is included in at least one embodiment. The appearances of the phrase "in one embodiment," "according to one embodiment," or "in some embodiments" in various places in the specification are not necessarily all referring to the same embodiment, nor are separate or alternative embodiments mutually exclusive of other embodiments. Moreover, various features are described which may be exhibited by some embodiments and not by others. Similarly, various requirements are described which may be requirements for some embodiments but not other embodiments.

The following description includes details to provide a thorough understanding of the examples. However, it is understood by one of ordinary skill in the art that the examples may be practiced even if every detail of a process or device in an example or embodiment is not described or illustrated herein. For example, electrical or optical components may be shown in diagrams that do not illustrate every electrical connection or every optical element in order not to obscure the examples in unnecessary detail. In other instances, such detail may be included to further explain the embodiment described.

The present disclosure relates to transforming beam quality of a laser beam. A typical diode laser can produce an elliptical shaped non-polarized laser beam. To meet the requirements for many applications (e.g., CD drives, CDROM drives, DVD drives and other optical disc readers and writers, laser printers, and scanners), an emitted laser beam can be transformed to a highly polarized and differently shaped laser beam suitable for a particular application. The shape of a beam may be transformed to various shapes. The transformation of an elliptical shaped beam to a circular shaped beam as discussed herein includes transformations where the resulting beam is approximately or nearly circular shaped. A circular shaped laser beam is also referred to herein as circularly symmetrical, indicating beam cross-sectional axis are of the same length, or approximately so. In some embodiments, the shape of the laser beam is transformed from an elliptical-shape to a circular shape by passing the laser beam through a pair of prisms positioned in a anamorphic configuration (e.g., a Brewster telescope configuration) which optically changes dimensions of the elliptical-shaped beam to become equal, or nearly equal, producing a circular beam. The angle of incidence of a near(input) surface of the prisms are adjusted relative to the incoming beam so that they are close to Brewster's angle, and transform the input beam to a suitable circular output beam. Brewster's angle, as used herein, is a broad term and is to be given its ordinary and customary meaning to a person of ordinary skill in the art (and are not to be limited to a special or customized meaning), and furthermore refer without limitation to an angle of incidence at which one polarization component of an incident laser beam is completely (or nearly so) transmitted into a material. When the prisms receive the input beam at or near Brewster's angle, the s-polarization component of the laser beam is reflected while the p-polarization component is transmitted into the prism, thus polarizing the laser beam to some degree. Input surfaces on one or both prisms can be coated with a polarization selective coating to further reflect the s-polarization component while allowing the p-polarization component to be transmitted, producing a highly polarized beam. The resulting laser beam exiting from such a prism configuration can be highly polarized and more circular shaped, and can now be used for numerous applications, such as the ones described above. Various embodiments of this invention relate to applications that include transforming the output beam from a diode laser or from a waveguide, as discussed below.

Herein, the terms "wavelength" ($\lambda$) and "frequency" ($f$) may be used interchangeably to characterize one parameter of laser radiation. Wavelength is defined herein as the wavelength in free space, and therefore either term (i.e., either wavelength or frequency) uniquely characterizes the laser radiation in accordance with the relationship $\lambda f = c$, where c equals the speed of light in the medium (herein assumed to be free space).

Recently, the use of diode lasers has grown. Increases in output power of diode lasers, together with the narrowing of output laser linewidths and wavelength stabilization have allowed for the direct doubling of lasers using periodically poled (PPLN) waveguides comprising, for example, Lithium Niobium ($LiNbO_3$), or waveguides comprising PP:MgO:LN, PP:MgO:LT, PPKTP, PP:SLN, or PP:SLT. Compact efficient solid state laser using such waveguides are becoming a drop-in replacement for Argon Ion lasers, and are now being produced by several manufacturers. In some embodiments, typical waveguide dimensions are roughly 2 to 3 um by 5 to 6 um (which is roughly the same size as single mode laser diodes). Just as in applications with diode lasers requiring a transformation of beam shape, one or more optical elements can be used for circularizing an asymmetric beam from a waveguide. In one aspect, an anamorphic prism pair offer a compact and low-cost method for transforming an asymmetric beam to a circular shaped beam. Furthermore, lasers, whose laser beam is typically not well polarized, are developing great interest as a low cost, efficient source of laser light, replacing larger, more costly, and less efficient gas lasers. Beam quality issues (e.g., beam shape and polarization) of a diode laser are further discussed below Beam Shape A typical diode laser 105 is shown in the illustration in FIG. 1A. Generally, laser action (resulting in coherent light output) can be achieved in a p-n junction formed by, for example, two doped gallium arsenide layers. The two ends of the laser diode are optically flat and parallel, with the rear facet 115 highly reflective (mirrored) and the front facet 110 partially reflective. The length of the p-n junction relates to the wavelength of the light to be emitted. The p-n junction is forward biased to drive holes to the junction from the p-type material and electrons to the p-n junction from the n-type material. At the p-n junction the electrons and holes combine so that a continuous current can be maintained. The recombination process produces incoherent light. Above a certain current threshold, the photons moving parallel to the p-n junction can stimulate emission and initiate laser action. That is, for electrons already in an excited state (an upper energy level, in contrast to its lowest possible level or "ground state"), an incoming photon for which the quantum energy is equal to the energy difference between its present level and a lower level can "stimulate" a transition to that lower level, producing a second photon of the same energy. When a sizable population of electrons resides in upper levels, this condition is called a "population inversion," and it sets the stage for stimulated emission of multiple photons. The emitted photons have a definite time and phase relation to each other resulting in a laser beam 120 (sometimes referred to herein simply the "beam") emitted from the front facet 110 having a high degree of coherence.

Figure 1B:
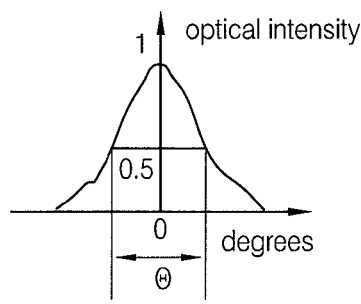
FIG. 1B is a graph illustrating a diode laser beam profile in the direction parallel to the layers that form the diode laser.
Figure 1C:
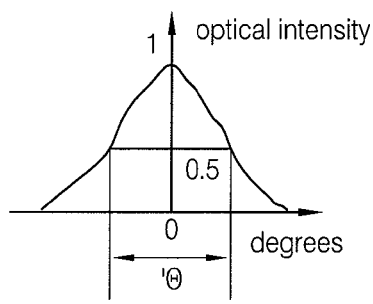
FIG. 1C is a graph illustrating a diode laser beam profile in the perpendicular direction.

The beam emitted from the diode laser junction spreads rapidly as it leaves the front facet 110. FIGS. 1B and 1C illustrate relative beam width profiles for the plane parallel to the junction (FIG. 1B) and the plane perpendicular to the junction (FIG. 1C). In the plane of the junction, the beam divergence, measured at full width half maximum is typically 6° to 15°. In the plane perpendicular to the junction, the beam divergence is about 24° to 46°, which creates an elliptical output pattern 125 in the far field. The output front facet 110 is, in the case of a laser diode, a rectangular aperture, for example, 1.5×0.3 microns with its long dimension oriented parallel to the p-n junction.

Figure 1D:
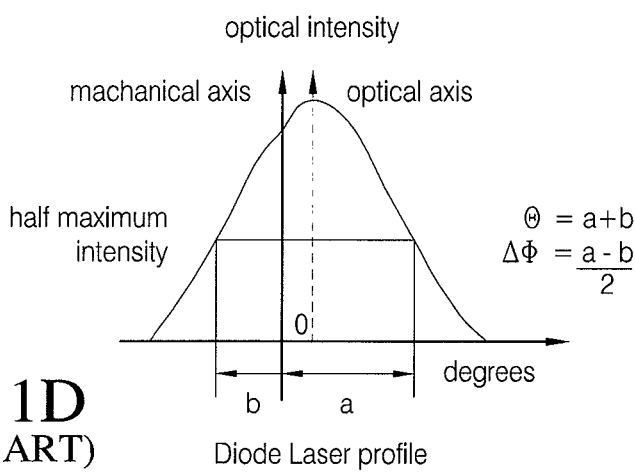
FIG. 1D is a graph illustrating a diode laser beam profile showing the mechanical axis and the optical axis.
Figure 2:
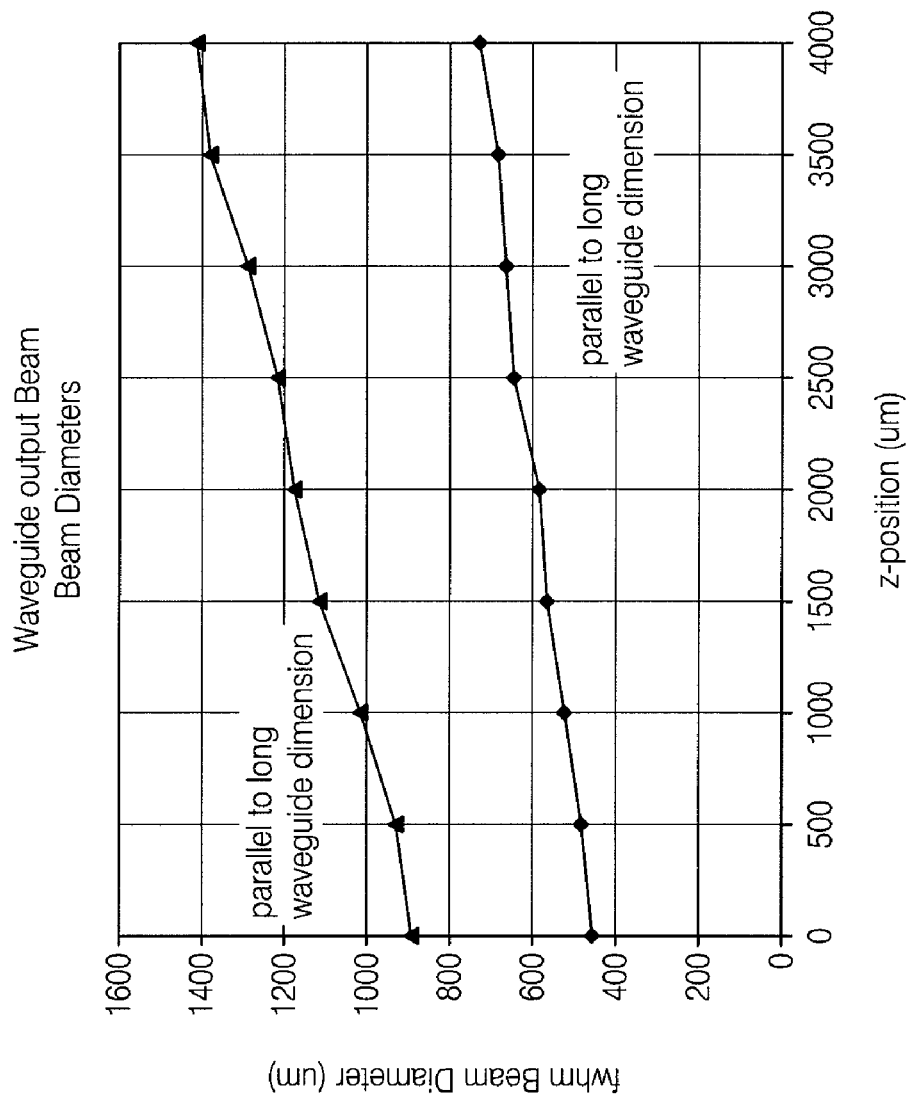
FIG. 2 is a graph illustrating a laser beam profile of a typical 488 nm waveguide.

In addition to beam shape, beam alignment can also be a factor when using a diode laser. Beam alignment for a laser is a measure of how well the optical axis coincides with the mechanical axis of the laser (usually expressed as an angle). The emitted laser beam 120 typically is not aligned with the mechanical axis of the diode laser, as illustrated in FIG. 1D. It is often critical to know the alignment of the beam output to the mechanical housing of a laser for alignment or sighting applications The coherent beam emitted from a frequency doubled laser diode using a nonlinear waveguide, such as a periodically poled lithium niobate (PPLN) waveguide, also spreads rapidly as it leaves its front facet. The laser beam output profile of a typical 488 nm waveguide with transverse dimensions of about 2.5×5.3 microns is shown in the illustration in FIG. 2, where the Full Width at Half Maximum ("FWHM") of the beam is shown as a function of z-position away from the waveguide. Full Width at Half Maximum is an expression of the extent of a function, given by the difference between the two extreme values of the independent variable at which the dependent variable is equal to half of its maximum value, and can be used to describe a measurement of the width of an object (for example, a beam diameter of a laser) when the object does not have sharp edges.

The typical waveguide output beam is elliptical. The beam diverges rapidly as it moves away from the waveguide, and in this example the FWHM beam divergence is measured to be 7.8° parallel to the small waveguide dimension and 4.0° parallel to the long waveguide dimension. The far field pattern is the Fourier transform of the intensity profile on the output facet. Because the dimension of the waveguide's output is smaller in one direction, the light is diffracted more in that direction than in the other direction causing the light from the waveguide to propagate as an elliptical diverging Gaussian beam. Generally a collimation system is employed with a waveguide to transform the beam into a collimated, approximately non-diverging beam; however the result of collimation is still an elliptical beam shape.

Polarization

Many optical applications require a high degree of laser beam polarization, often exceeding a 100:1 polarization ratio. Polarization ratio as used herein, is a broad term and is to be given its ordinary and customary meaning to a person of ordinary skill in the art (and are not to be limited to a special or customized meaning), and furthermore refer without limitation to the ratio between two orthogonal polarization components (e.g., an s-polarization component and a p-polarization component) of a laser beam, for example, 10:1 or 500:1. High polarization ratios (e.g., 500:1) are readily achievable with current gas laser technology such as HeNe or Argon Ion. However, many diode laser and waveguides do not exhibit the high polarization ratios required by some applications. For example, a typical laser diode may emit a laser beam having a 10:1 polarization ratio. Additionally, the polarization state of a typical waveguide's output beam will often exhibit a dependence on waveguide temperature, ranging from as low as 5:1 to as high as 200:1. The directly doubled diode approach for compact blue-green lasers utilizing waveguides are more attractive when the waveguide's output beam is highly polarized and controlled for use in polarization sensitive applications.

If a frequency converted laser system's output power is to be controlled with a feedback loop, for example in an automatic power control (APC) system, the polarization state of the input beam provided to the APC pickoff mirror typically needs to be well controlled since the pickoff mirror reflectivity is often polarization dependent. Also, certain original equipment manufacturer ("OEM") applications require round beams that are highly polarized to achieve their system performance requirements. Examples are systems that deliver the laser light with single mode polarization maintaining fibers, and systems whose optical engines have polarization sensitive optics that focus laser beams into circular spots.

The anamorphic optical systems described herein comprising a polarization selective coating can be used to increase beam quality, e.g., circularize the beam and improve the polarization ratio of an output beam. Polarization selective coating, as used herein, is a broad term and is to be given its ordinary and customary meaning to a person of ordinary skill in the art (and are not to be limited to a special or customized meaning), and furthermore refers without limitation to a structure that affects one polarization component substantially more than another polarization component, for example, transmitting (or reflecting) one polarization component (e.g., p-polarization) substantially more than another polarization component (s-polarization). The laser beams of improved beam quality can then be provided for use in polarization sensitive applications requiring a highly polarized laser beam of a circular or nearly circular beam shape, or another desired shape.

Anamorphic Prism Beam Expanders

As stated above, many end user applications require a circular-shaped beam rather than an elliptical-shaped beam. For such applications, an anamorphic optical system can be provided to receive the elliptical output beam and transform it into a differently shaped beam, for example, a circular shaped beam. As used herein, the phrase anamorphically changed beam refers to changing at least one aspect of an input laser beam by an anamorphic system, for example, changing in input beam to a differently shaped beam, including changing an elliptical shaped beam to a more circular shaped beam. At least partly because of size constraints, laser diode systems can effectively use prism magnification to circularize the elliptical beam. The prisms used in anamorphic optical systems are relatively easy to manufacture, they have a good transmitted wavefront, and are easy to align.

Figure 3:
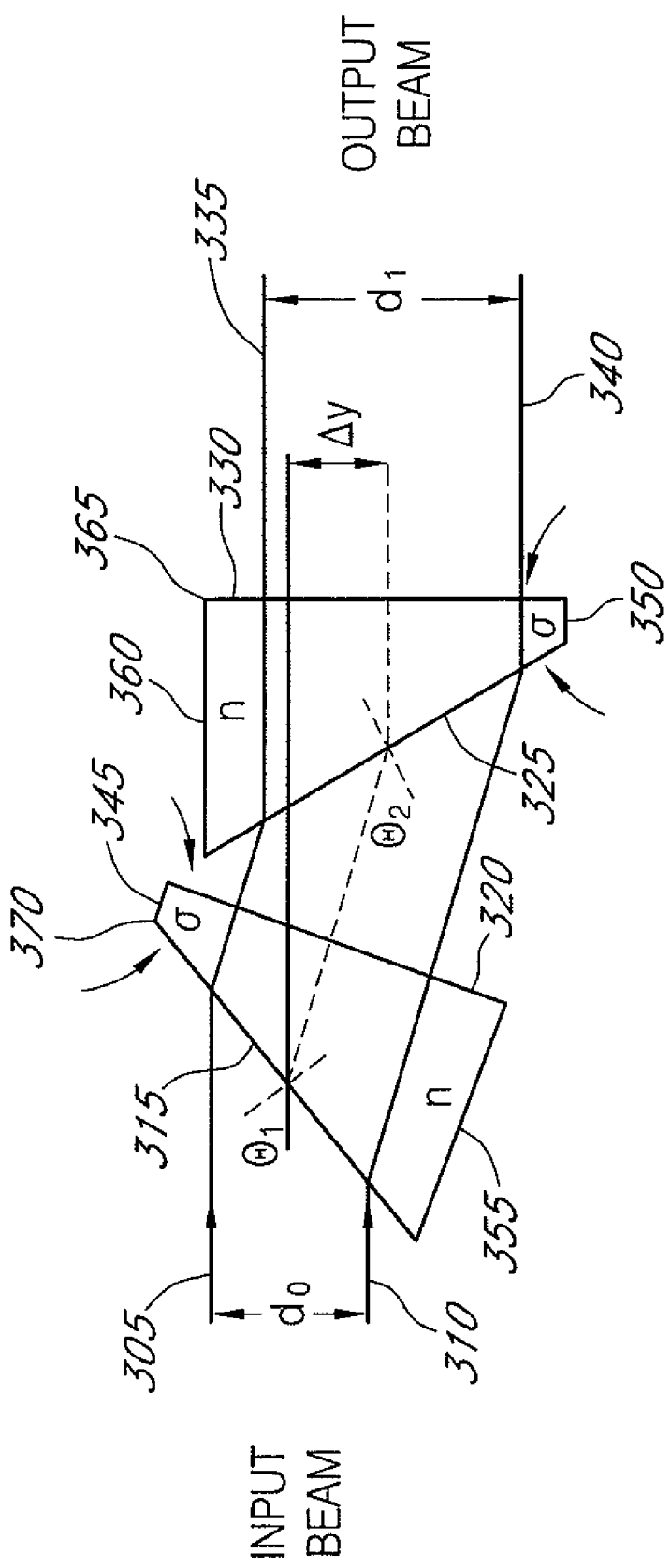
FIG. 3 is a schematic of a pair of optical elements forming an anamorphic optical system.

One conventional prism configuration for transforming an elliptical beam to a circular beam comprises a Brewster telescope 300 as illustrated in FIG. 3. An elliptical input beam is received at the proximal surface 325 of prism 370 at an angle of incidence ("AOI") $\theta_1$ and refracts when the beam enters the prism 370. The input beam propagates through prism 370 and exits at far (output) surface 320. The beam is received at the proximal surface 325 of prism 365 at an angle of incidence $\theta_2$ and refracts as it enters prism 365. The beam propagates through prism 365 and exits at far surface 330 in a direction parallel to the input beam.

Prisms 370 and 365 can be aligned to receive an elliptical input beam (e.g., from either a diode laser or a waveguide) having a beam diameter $d_0$ in one direction (e.g., one of the two orthogonal axis of diameter of the elliptical beam), transform the beam diameter to be equal (or nearly so) to the beam diameter in the other direction, and provide a circular (or more circular) output beam having a beam diameter of $d_1$. The input surfaces 315, 325 are typically not coated with an anti-reflection (AR) coating because they are configured to receive the input beam at an angle of incidence of Brewster's angle. Aligning the prisms 370, 365 at Brewster's angle also provides a small degree of polarization improvement, as described in more detail below. The far surfaces 320, 330 can have an anti-reflection ("AR") coating (e.g. a coating which is designed to be highly transmissive) which can be designed for the particular laser wavelength used. The Brewster telescope configuration has the advantage of being compact and produces an exit beam parallel to the incoming beam, although the optical axis of the exit beam is offset from the input beam. Differences in elliptical ratios can be accommodated by rotating the prism pair to different angles which increases or decreases the magnification of the beam diameter in one direction.

However, a conventional Brewster telescope may not meet the requirements ideal for all implementations, especially those requiring a highly polarized beam. For a given prism in a Brewster telescope configuration, if the prism is aligned to decrease the magnification, the angle of incidence of the input beam on the near surface typically moves away from Brewster's angle. This results in increased reflectivity for the p-polarization component and a decrease in the overall transmission of the Brewster telescope. Coating the input faces of the prisms with an anti-reflection coating increases light transmission, however, the conventional Brewster telescope does little to improve or control the polarization state of the laser beam, control of which can be critical for certain applications.

Figure 4:
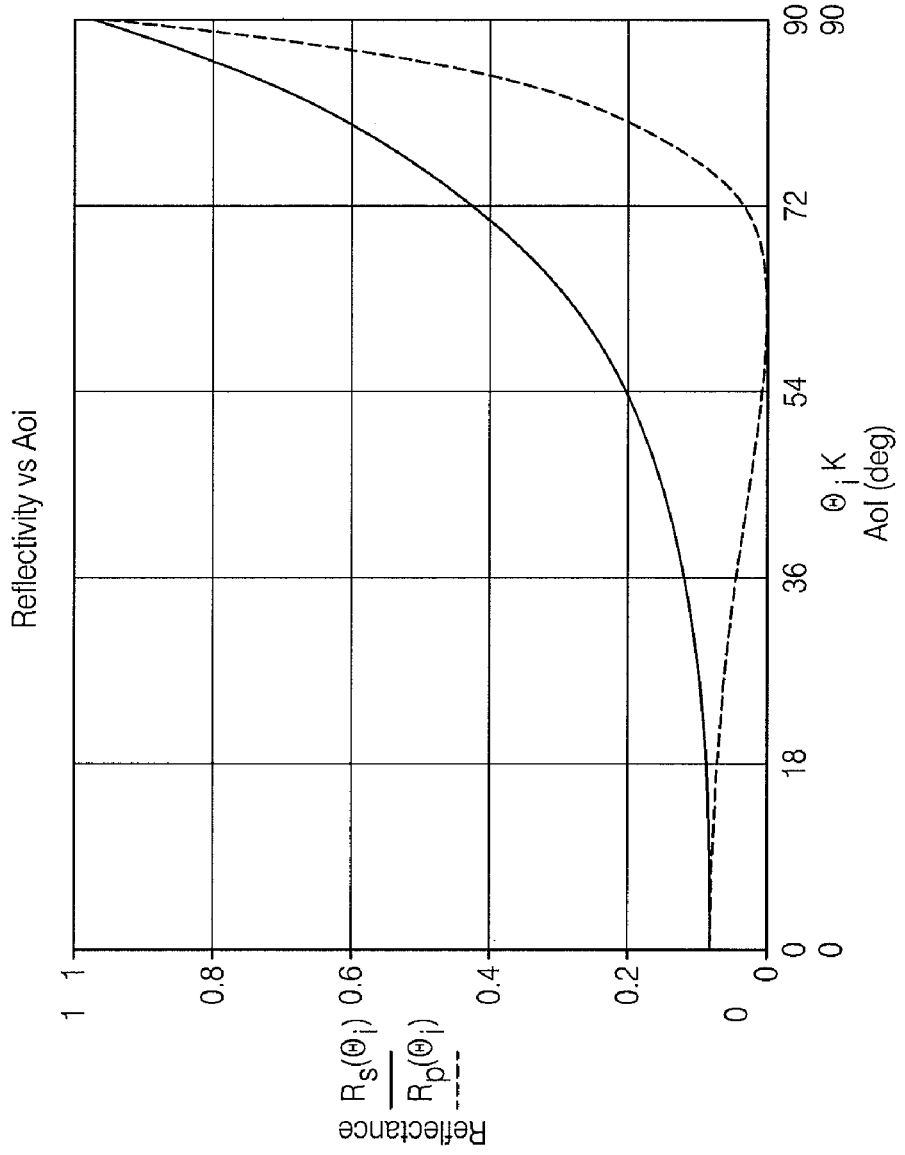
FIG. 4 is a graph of reflectivity vs. angle of incidence for one uncoated input surface of a prism showing different reflectivity for s-polarization and p-polarization components of an incident laser beam.

FIG. 4 is a graph illustrating reflectivity vs. angle of incidence for one uncoated input surface of a prism, showing different reflectivity for the s-polarization component 405 and p-polarization component 410 of a laser beam from a diode laser. As illustrated in FIG. 4, even if the angle of incidence of the input beam at the input surfaces (315, 325 FIG. 3) of both prisms are at Brewster's angle, the improvement in the polarization ratio is only about a factor of two, which is inadequate for many applications. For example, improving the polarization ratio from 10:1 to 20:1 would not be useful or significant for an optical system that has a 500:1 polarization ratio requirement. At Brewster's angle the s-polarization component "sees" a much higher Fresnel reflectivity than the p-polarization component. However, the transmission for the s-polarization component of a laser beam incident on a fused silica prism at Brewster's angle can still be approximately 75% per surface (depending on wavelength and prism material). For two surfaces at Brewster's angle this corresponds to a total transmission of about 56%. If the input surfaces are not exactly at Brewster's angle any improvement in polarization ratio of a laser beam exiting the prism is even less.

Figure 5:
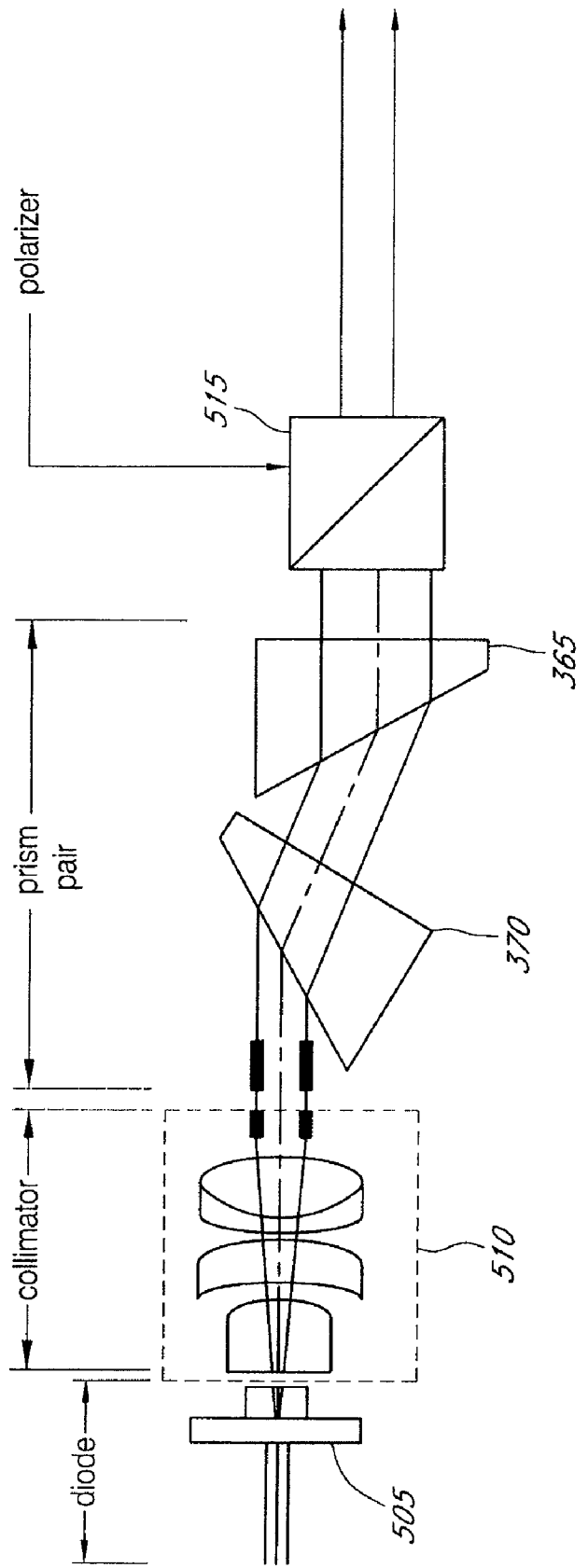
FIG. 5 is a diagram of an optical system that includes a polarizing element positioned to receive light from an anamorphic optical system.

FIG. 5 illustrates an example of a conventional diode laser system 500 that can provide a polarized circular beam. The diode laser system 500 includes a diode laser 505 that emits an elliptical laser beam. Collimator 510 is positioned to receive the diverging beam from the diode laser 505 and collimates the beam using one or more optical elements. The collimated elliptical beam propagates through prisms 370, 365 which are configured as a Brewster telescope and transform the elliptical beam into a circular beam. To form a highly polarized output beam, diode laser system 500 employs a bulk polarizer 515 positioned after prism pair 370, 365 that receives and polarizes light from the Brewster telescope. However in such a configuration, bulk polarizer 515 disadvantageously adds cost to the laser unit and increases the overall size of the unit.

Figure 6:
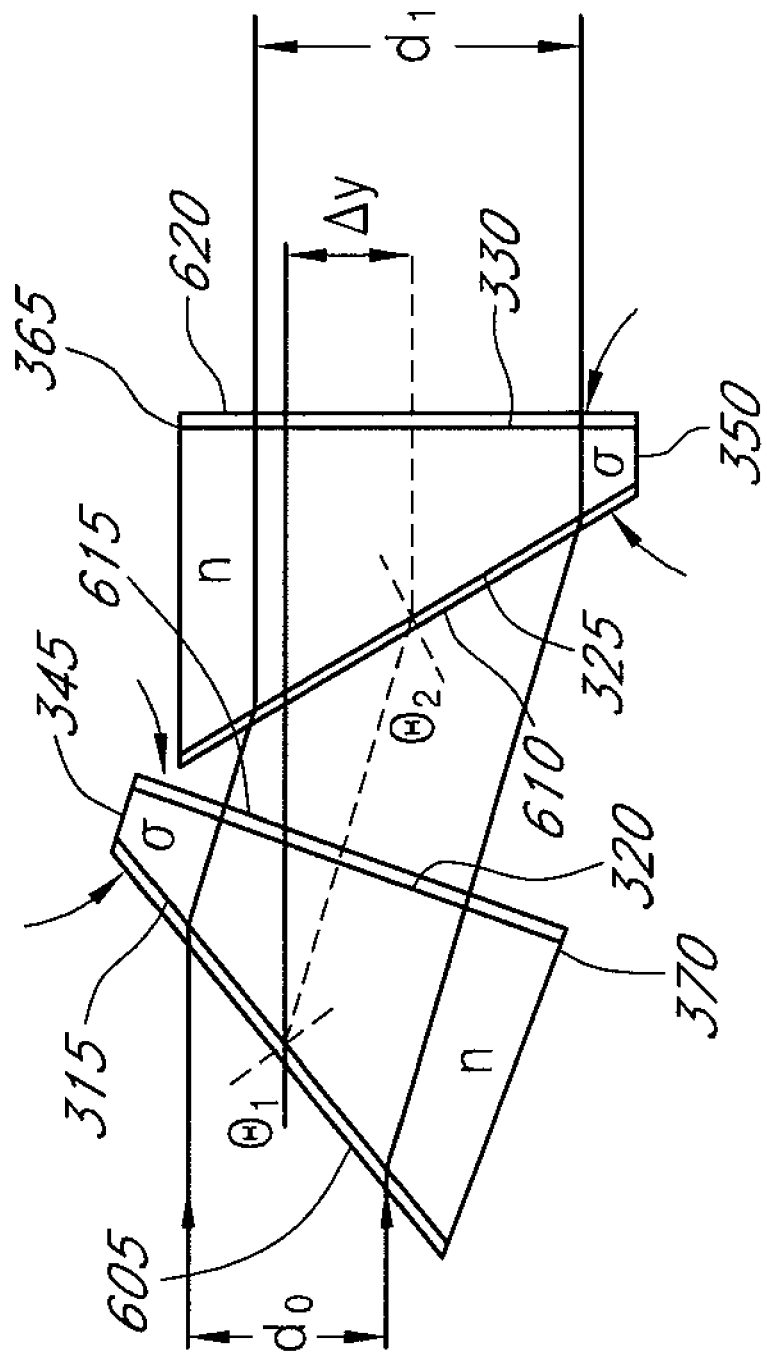
FIG. 6 is a diagram of prisms in a Brewster's telescope configuration and having a polarization selective coating on an input surface of at least one of the prisms.
Figure 7:
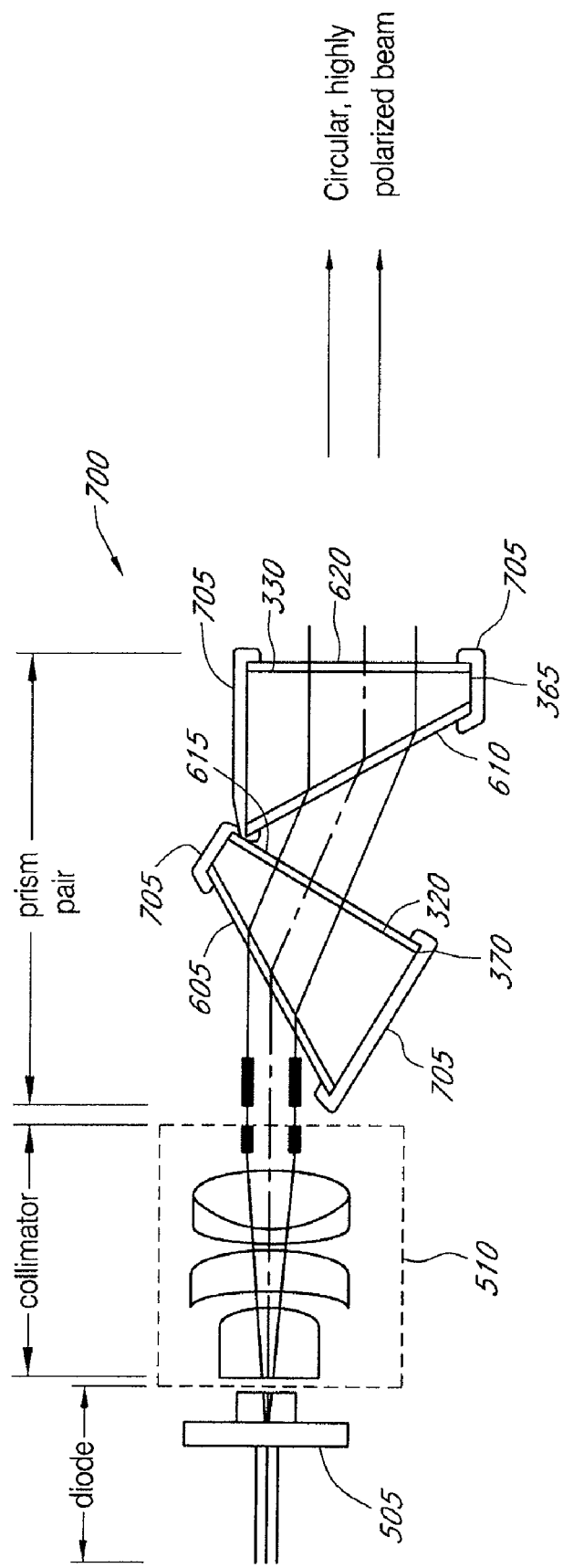
FIG. 7 is a diagram of a Brewster's telescope in a system that includes a laser diode that emits an elliptical, diverging laser beam, and a collimator that collimates the beam (e.g., reduces beam divergence).

FIGS. 6 and 7 illustrate an anamorphic system 600 that overcomes the above-described problems, transforming a non-polarized elliptical laser beam input into a highly polarized circular beam. Anamorphic system 600 is described herein in the context of a pair of prisms that transforms a non-highly polarized beam having an elliptical shape (e.g., generated by a laser diode and where the beam has been first collimated by a collimator) to highly polarized beam having a circular shape. In some embodiments, the anamorphic system can receive the beam from a waveguide. Anamorphic system 600 can have many other embodiments incorporating its inventive aspects where a non-highly polarized non-circular laser beam is transformed into a highly polarized beam having a more circularly symmetrical shape than the original non-circular shaped beam.

FIG. 6 illustrates anamorphic system 600 having a pair of optical components prisms 370, 365 configured as a Brewster telescope. In some embodiments, at least one of prisms 370, 365 is coated with a polarization selective coating 605, 610 on a proximal (input) surface 315, 325. The distal (output) surfaces 320, 330 of one or both prisms 370, 365 can be coated with an anti-reflection coating to increase the transmission of light propagating from the prisms. In some embodiments, at least one surface of the proximal surfaces 315, 325 and the proximal surfaces 320, 330 are coated with a polarization selective coating. The polarization selective coating provides for high reflectance of one polarization component and high anti-reflectance (or transmission) of an orthogonal polarization component, for example, the s-polarization component and the p-polarization component, respectively. In some embodiments, the polarization selective coating reflects 95% or greater of the s-polarization component and transmits 95% or greater of the p-polarization component. In other embodiments, the reflectance of the s-polarization component is 98% or higher and the transmission of the p-polarization component is 98% or higher. In one example embodiment, if a polarization selective coating reflects about 98% of the s-polarization component and transmits about 98% of the p-polarization component, the polarization ratio improves by a factor of about 50.

The polarization selective coating can comprise a single material, or more typically multiple layers of material (or film) forming a film stack, which is also referred to as a dielectric coating. Such coatings are generally designed to achieve the highest degree of polarization at a specific angle of incidence and centered at a specific wavelength. Due to the different angles of incidence of an input beam on the input and output surfaces of the pair of prisms 370, 365, differently designed polarization selective coatings can be used on the different surfaces, where each coating is designed for the particular angle of incidence at that surface (and the wavelength used). Examples of suitable coatings include The use of such a polarization selective coating can greatly improve output beam polarization over a range of input angles that would allow the anamorphic magnification to be adjusted for small variations in diode output beam asymmetry.

In operation, the two prisms 365, 370 are positioned at approximately Brewster's angle, an input laser beam is provided to an input surface of the first prism 370, and the resulting output beam shape is monitored. Using an adjustment system, one or both of the prisms 365, 370 can be positioned, (e.g., translated or rotated) to provide the desired beam shape to anamorphically transform an input beam. The first and/or second prisms 365, 370 may be rotated, for example, about an axis parallel to the y-axis shown in FIG. 6. In various embodiments, the prisms may be rotated or positioned either as a unit comprising the two prisms 365, 370, or they can be rotated or positioned separately. Due to the polarization selective coating design which can have some angle of incidence sensitivity, an elliptical input beam can be transformed into a very highly polarized output beam if the angles of incidence of the input beam on one or both prisms 365, 370 is at or near Brewster's angle, for example, within a range of +/−2 degrees of Brewster's angle. If it is necessary to change the angle of incidence and rotate one or both of the prisms significantly from Brewster's angle, and a high polarization ratio is required, a coating can be selected that is suitable for the particular range of angles of incidence expected.

Using a suitably designed polarization selective coating, high polarization ratios are possible. For example, polarization ratios of about 600:1 have been observed using a prism pair with one surface having a polarization selective coating. Smaller or larger ratios can be achieved depending on the polarization coating selected, whether one or both surfaces are coated, and the angle of incidence. Typically, the highest polarization ration is a configuration where both prisms are aligned such that the angle of incidence of the input laser beam on the prism's proximal surfaces is at Brewster's angle, both proximal surfaces are coated with a polarization selective material, and the polarization selective material is selected to optimally match the wavelength of the input laser beam to maximize or increase the s-polarization component reflection and minimize or decrease the p-polarization component reflection.

Figure 19A:
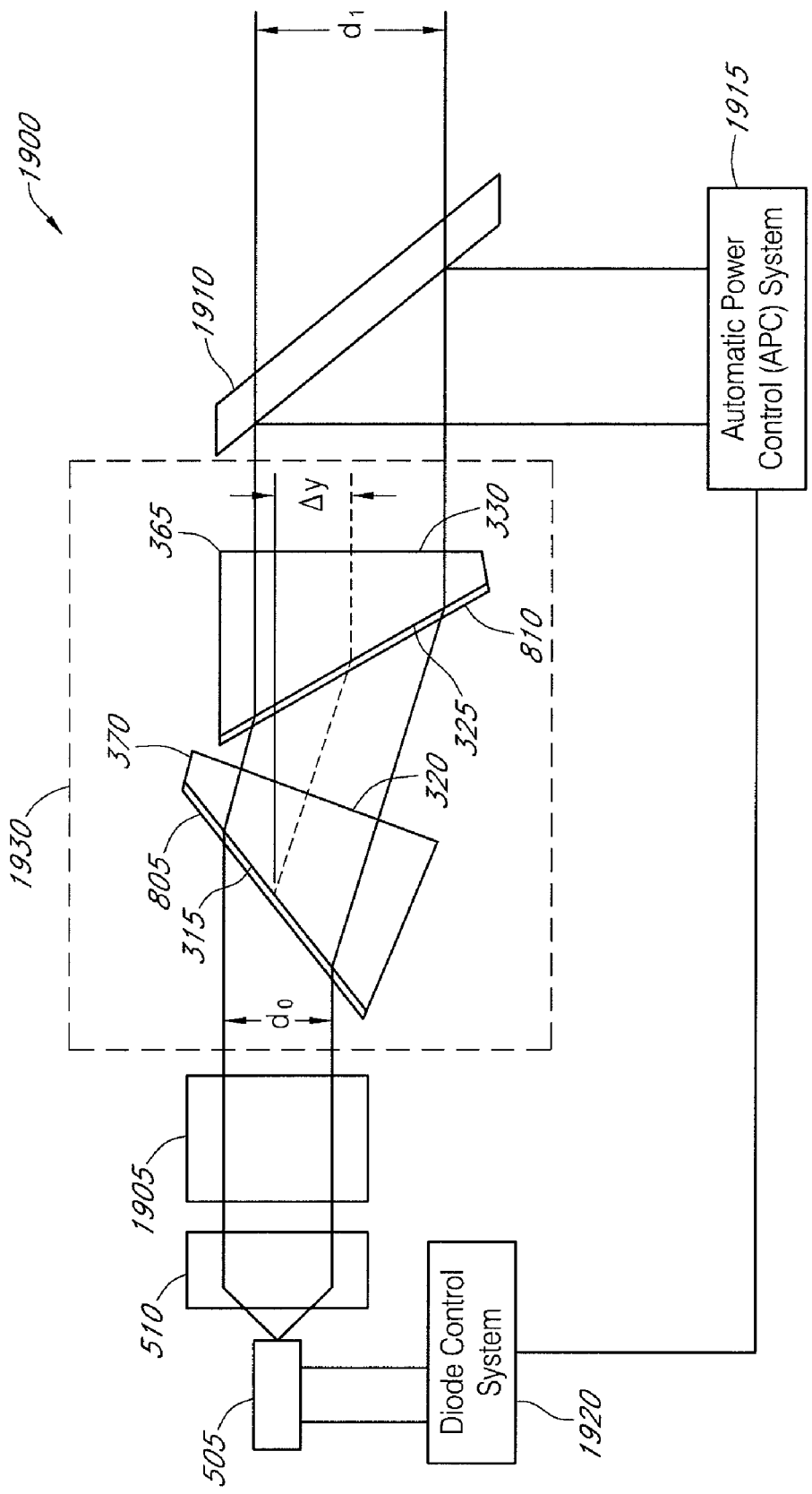
FIG. 19A is a diagram of a diode laser system that incorporates certain aspects of the invention.
Figure 19B:
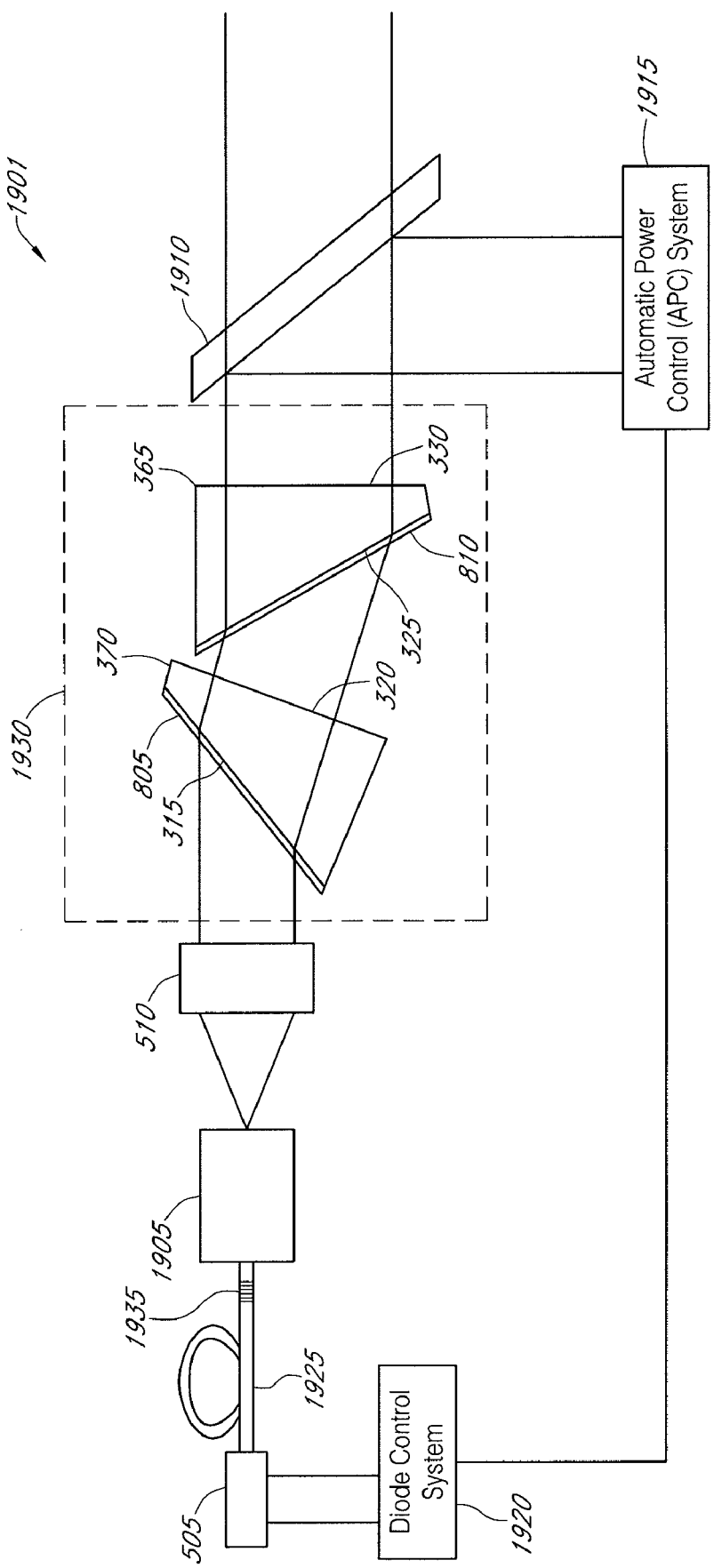
FIG. 19B is a diagram of a fiber Bragg grating stabilized laser system that incorporates certain aspects of the invention.

FIG. 7 is a diagram of a laser diode system 700 that incorporates the anamorphic optical system 600 shown in FIG. 6. The laser diode system 700 includes a diode laser 505 that emits an elliptical beam. Collimator 510 receives and collimates the elliptical beam (e.g., reduces divergence) using one or more optical elements and provides a collimated beam to the prism pair 370, 365. In this embodiment both of the proximal surfaces 315, 325 of the prisms 370, 365 are coated with a polarization selective material that reflects the s-polarization component and transmits the p-polarization component. In this embodiment, distal surfaces 320, 330 of the prisms 370, 365 are coated with an anti-reflectance coating to increase transmission of light from the prisms. FIGS. 19A and 19B, discussed below, illustrate other embodiments of laser diode systems comprising anamorphic optical systems that produce a highly polarized light beam.

The laser diode system 700 also includes a mechanical adjustment system 705 that is configured to move or rotate one or both of the prisms to change the angle of incidence of an input beam such that the ellipticity of the input beam is transformed to an output beam of approximately circular symmetry. In some embodiments, the prisms 370, 365 are each mounted on a movable surface of the adjustment system which can position each prism independently, and then fix each prism at a desired position, for example, with a set screw. In some embodiments, adjustment system 705 is configured to rotate one end of each prism (e.g., end 345 or 350 FIG. 6) to change the angle of incidence. In some embodiments, adjustment system 705 includes a mount for each prism, the prisms are attached to the mounts, and the mounts can rotate the prisms as required to produce the desired approximately circular output beam. Typically, the prisms are adjusted to produce a desired circular beam shape suitable for a particular application and then not adjusted again. One a prism is positioned as desired, the adjustment system secures the prism in position.

In addition to laser diodes, other laser applications sometimes suffer from elliptical beams that also have poor (or just insufficient) polarization ratio. For example, diode pumped solid state lasers using waveguide gain mediums can produce elliptical beams and could utilize the anamorphic optical system described herein to transform the beam shape and produce a higher polarization ration.

Figure 8:
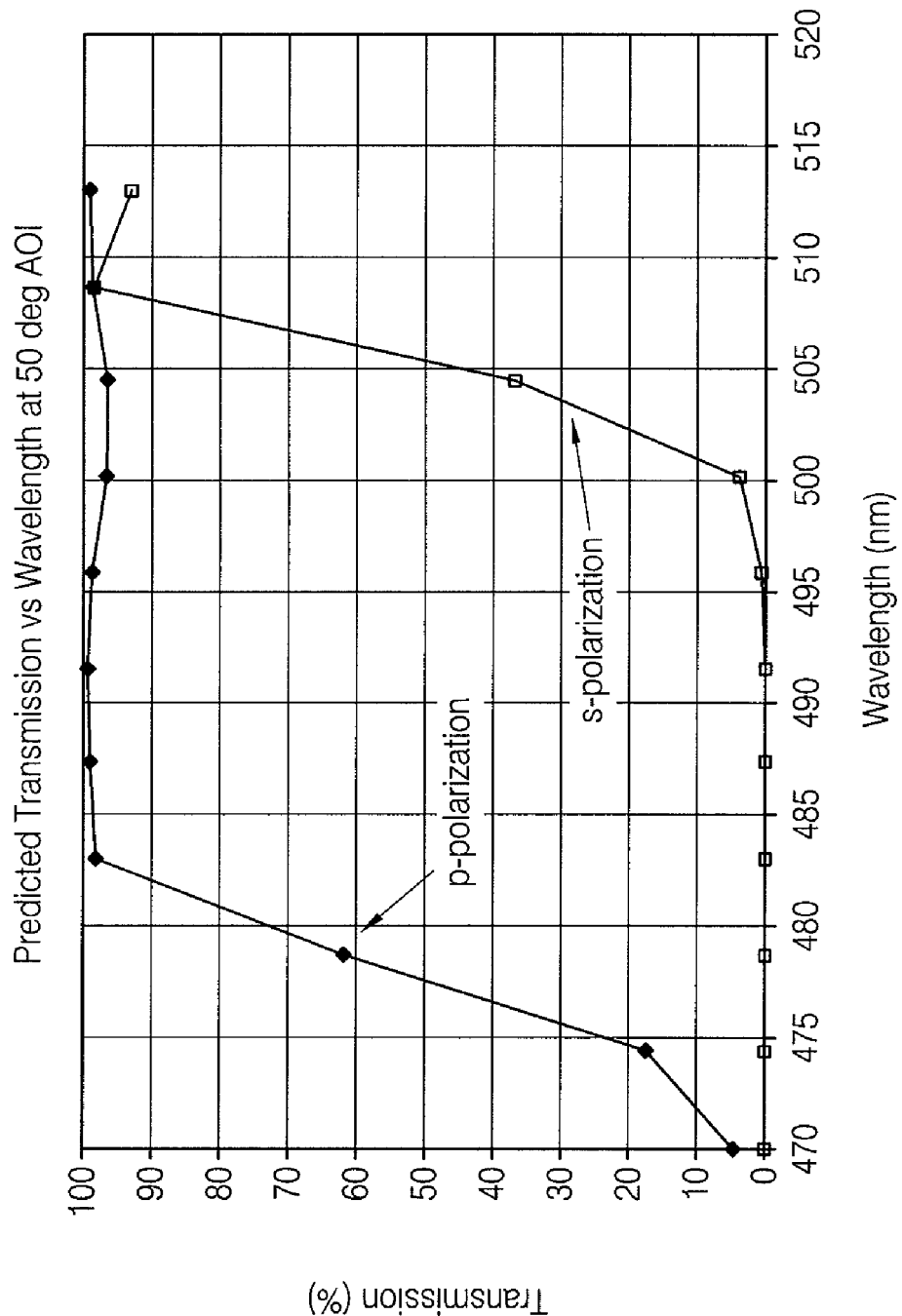
FIG. 8 is a graph that shows predicted transmission vs. wavelength for a polarization selective coating to be applied to the near surface of one or both a prism in Brewster's telescope, where the coating that is highly reflective of the s-polarization component and anti-reflective of the p-polarization component, and where the angle of incidence of the input beam on the input surface is 50 degrees.

FIGS. 8-11 illustrate the effectiveness of using a polarization selective material to coat at least one of the input surfaces of a prism pair configured as a Brewster telescope. Specifically, FIGS. 8-11 illustrate certain predicted and measured percentages of transmission vs. wavelength for a fused silica prism used in a Brewster telescope configuration having an input surface coated with a polarization selective coating, where an input laser beam is at 488 nm, and for various angles of incidences. FIG. 8 is a graph that illustrates an example of the transmission vs. wavelength of a theoretical model for a polarization selective coating that provides for s-polarization component high reflectance and p-polarization component anti-reflectance, and that can be applied to the proximal surface of one or both prisms configured as a Brewster telescope. The angle of incidence in this example is 50 degrees. As can be seen from the graph, the transmission of the s-polarization component is about 0% at wavelengths less than 493 nm. The transmission of the p-polarization component increases from about 5% to about 99% or higher between 470 nm and 485 nm. In particular, at 488 nm the transmission for the s-polarization component is about 0.04% while the transmission for the p-polarization component is about 99.4%. The unwanted s-polarization component "sees" a much lower transmission (higher reflectivity) than the p-polarization and is then reflected out of the beam path.

Figure 9:
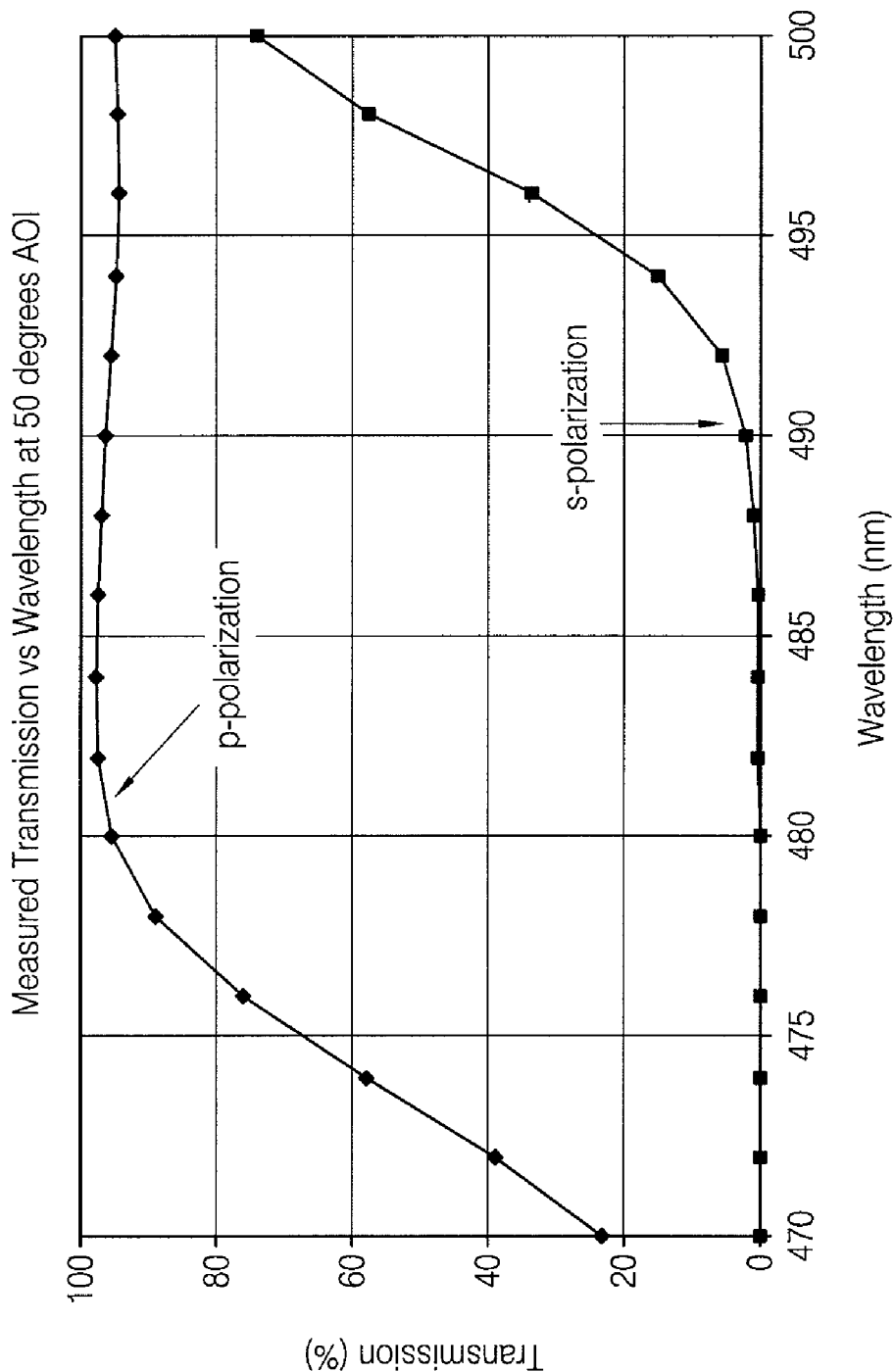
FIG. 9 is a graph that shows measured transmission vs. wavelength for a polarization selective coating to be applied to the near surface of a prism used in a Brewster telescope, the coating being highly reflective of the s-polarization component and anti-reflective of the p-polarization component, where the angle of incidence of the input beam on the input surface is 50 degrees.
Figure 10:
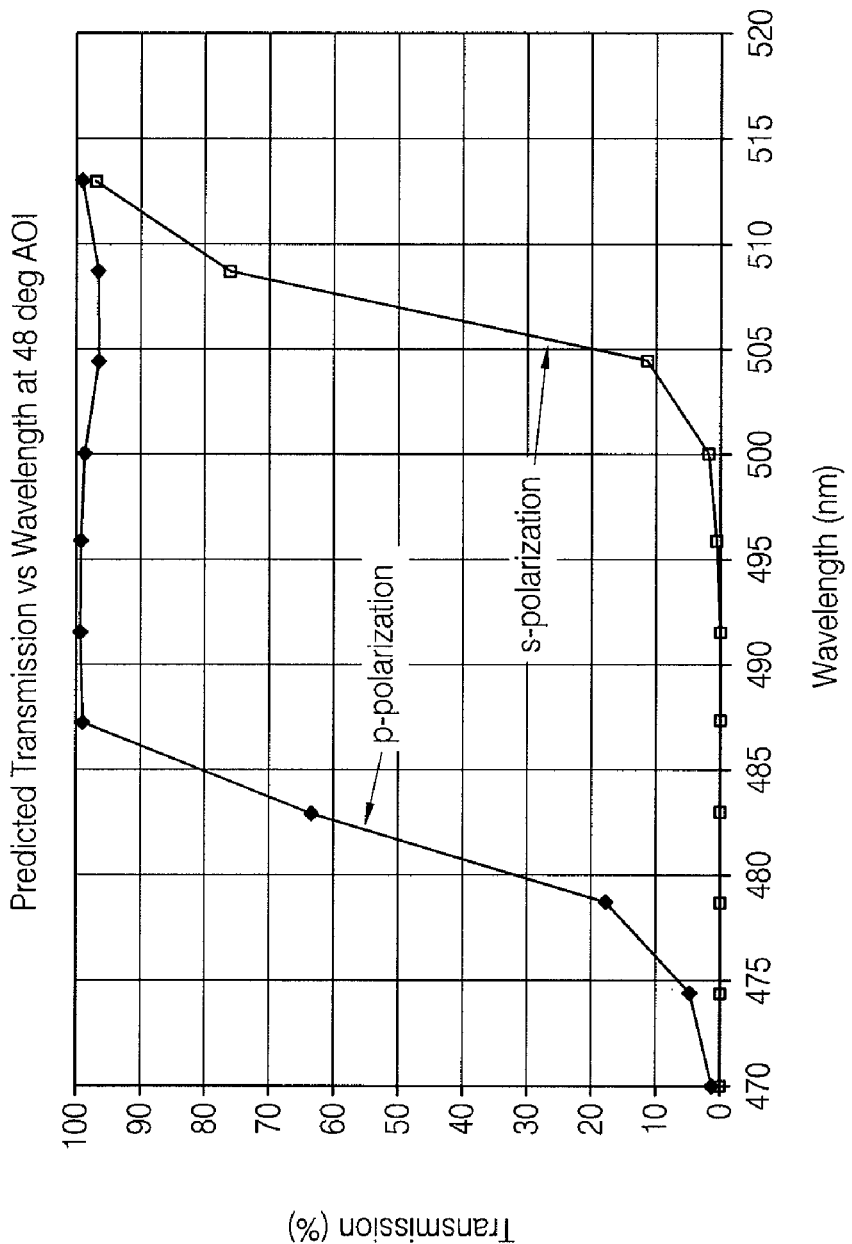
FIG. 10 is a graph that shows predicted transmission vs. wavelength for a polarization selective coating to be applied to the near surface of a prism used in a Brewster telescope, the coating being highly reflective of the s-polarization component and anti-reflective of the p-polarization component, where the angle of incidence of the input beam on the input surface is 48 degrees.

FIG. 9 is a graph that shows the measured transmission vs. wavelength curve for the silica prism positioned at a near Brewster's angle (AOI=50 degrees) and used in a Brewster telescope. At 488 nm, the measured transmission for the s-polarization component is 0.14%, while the transmission for the p-polarization component is 97.1%. FIG. 10 is a graph that shows a predicted transmission vs. wavelength for an angle of incidence of 48 degrees for a theoretical model of an s-polarization component highly reflective p-polarization anti-reflective coating to be applied to the near Brewster surface of one or both prisms configured in a Brewster telescope configuration. As illustrated, the unwanted s-polarization component has a much lower transmission (higher reflectivity) than the p-polarization and is reflected out of the beam path. In this example, at a wavelength 488 nm the transmission of the s-polarization component is about 0.03% and the transmission of the p-polarization component is about 98.9%.

Figure 11:
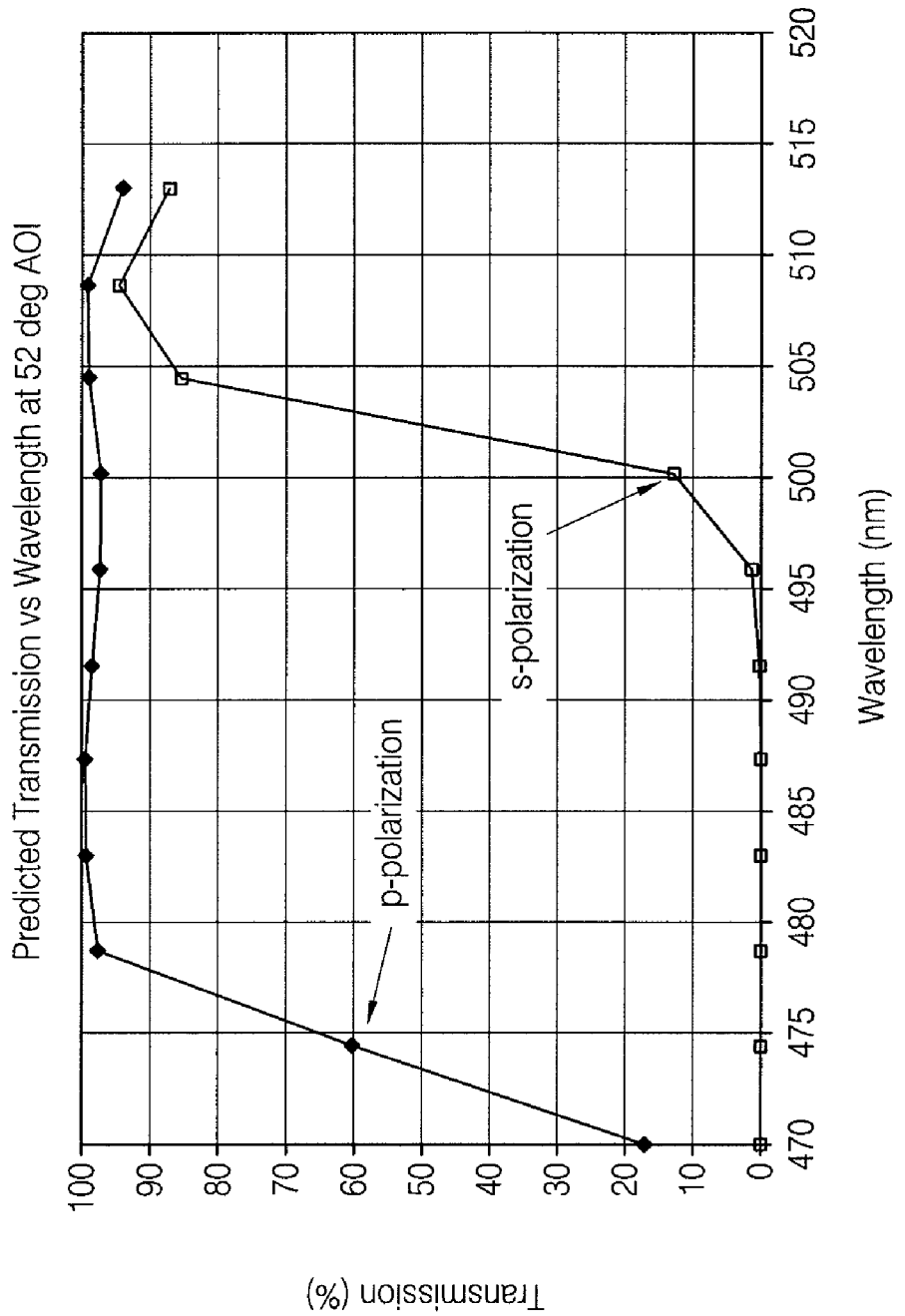
FIG. 11 is another graph that shows a predicted transmission vs. wavelength for a polarization selective coating to be applied to the near surface of a prism in a Brewster telescope, the coating being highly reflective of the s-polarization component and anti-reflective of the p-polarization component, where the angle of incidence of the input beam on the input surface is 52 degrees.

FIG. 11 is a graph illustrating another example of a predicted transmission vs. wavelength relationship where the angle of incidence is 52 degrees for a theoretical model of an s-polarization component highly reflective p-polarization anti-reflective coating to be applied to the near Brewster surface of one or both prisms configured in a Brewster telescope configuration. In this example, at 488 nm the transmission of the s-polarization component is 0.07% while the transmission of the p-polarization component is 99.7%. As can be seen from the FIG. 11, the unwanted s-polarization component has a much lower transmission (higher reflectivity) than the p-polarization and is then reflected out of the beam path.

Figure 12:
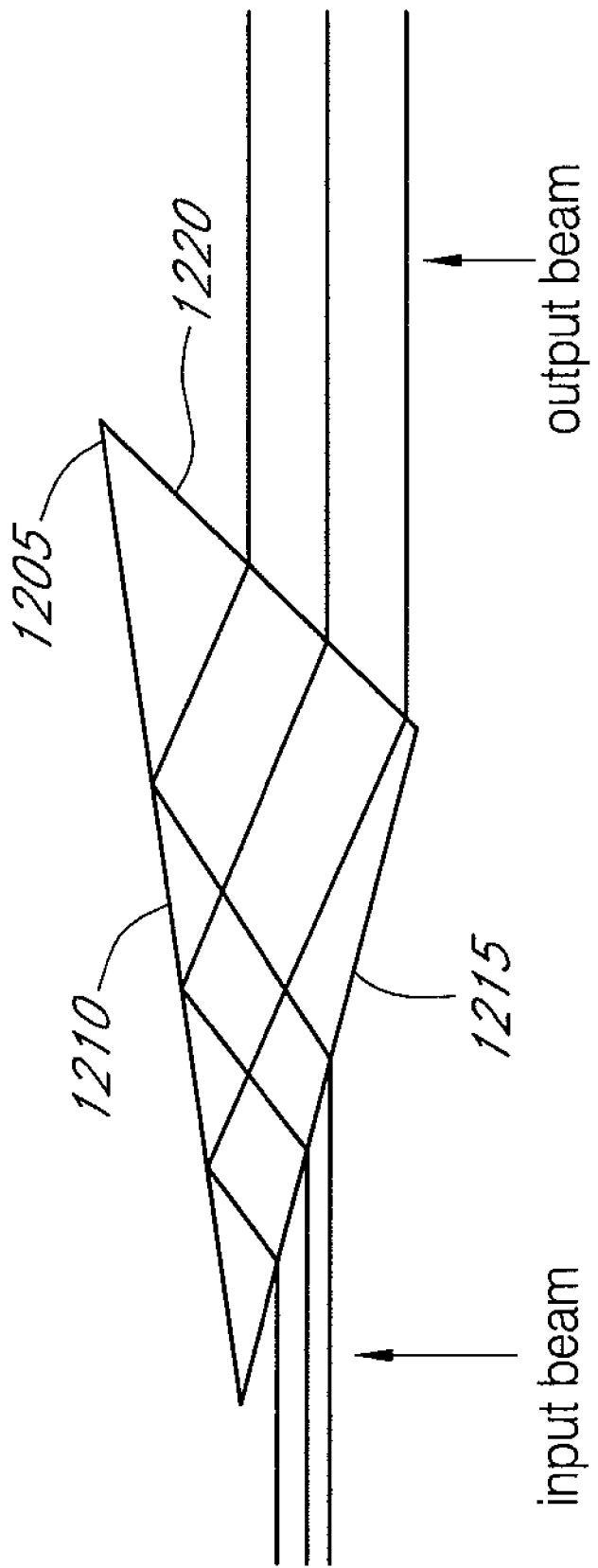
FIG. 12 is a diagram of one embodiment of a single optical element configured to produce a polarized circularly symmetrical shaped exit beam from an elliptical input beam.
Figure 13:
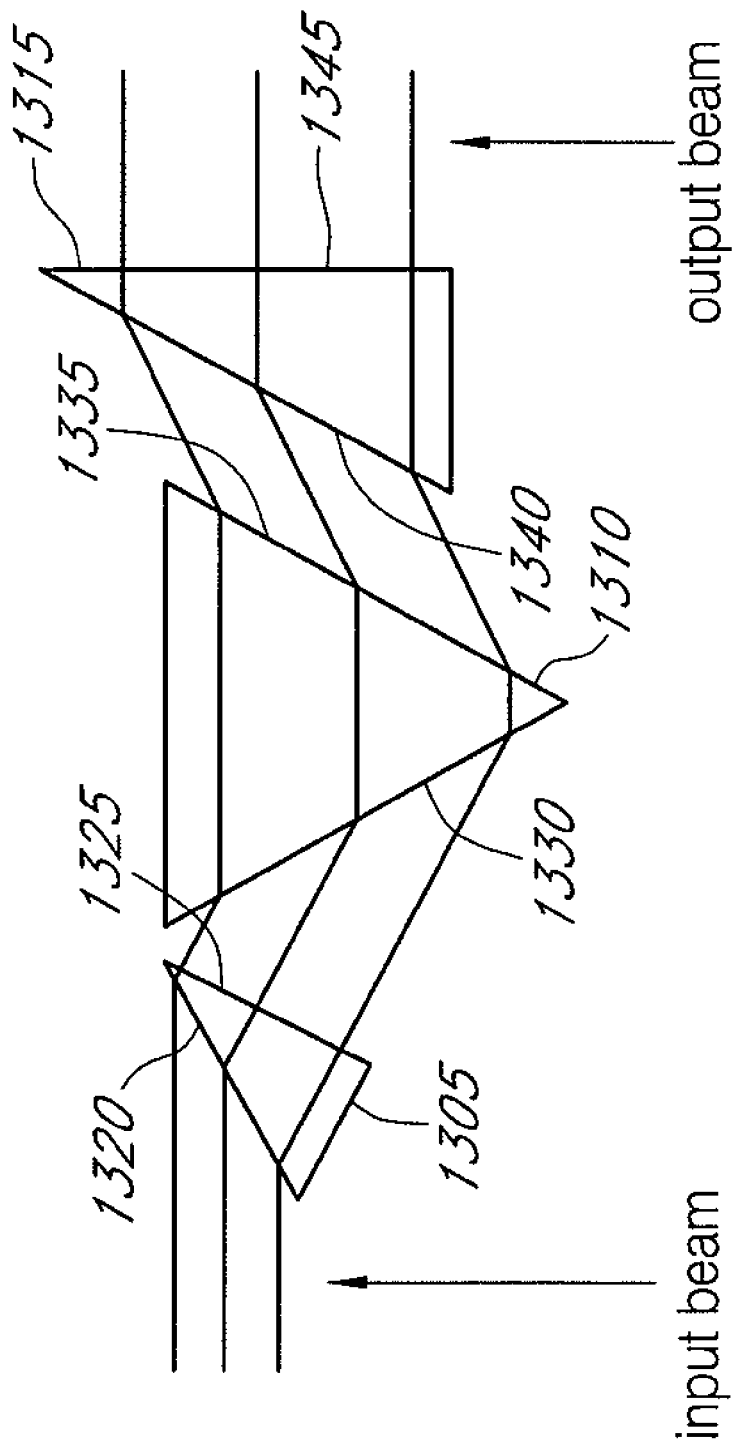
FIG. 13 is a diagram of one embodiment of three optical elements configured to produce a polarized circularly symmetrical exit beam from an elliptical input beam.
Figure 14:
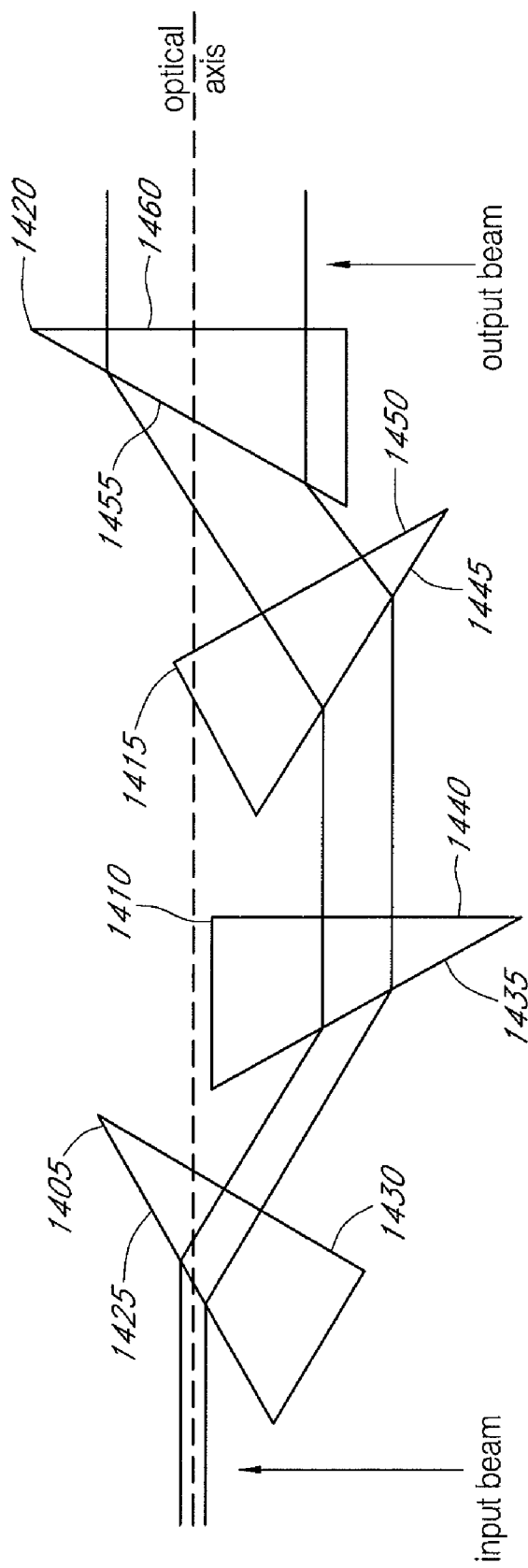
FIG. 14 is a diagram of one embodiment of four optical elements configured to produce a polarized circularly symmetrical exit beam from an elliptical input beam.

FIGS. 12-14 illustrate other embodiments of optical systems that use one or more optical components (e.g., prisms) to produce a highly polarized and circular-shaped exit beam from an elliptical input beam. FIG. 12 shows an optical system configuration using a single prism 1205 that magnifies or increases the size of one axis of the elliptical beam to produce a circular beam. Prism 1205 has a proximal surface 1210 aligned to receive an input beam at or near Brewster's angle, for example, within +/−2 degrees of Brewster's angle. Prism 1205 also has a reflection surface 1215 configured to internal reflect the beam propagating through the prism 1205 and a far (exit) surface 1220 which refract the beam. The combination of refraction and reflection within the prism 1205 causes one lateral dimension of the beam to be altered, e.g., increase with respect to the dimension in the orthogonal direction. Accordingly, the major axis of the elliptical beam may be reduced (or the minor axis increased) to cause the beam to be more circularly shaped.

The proximal surface 1210 of the prism 1205 can also be coated with a polarization selective coating to reflect the s-polarization component and transmit the p-polarization component. In some embodiments, reflection surface 1215 can be coated with a reflective coating or material to increase or maximize the internal reflection of the input beam. Distal surface 1220 can be coated with an anti-reflection material to increase or maximize the transmission of the beam through far surface 1220. In some embodiments, distal surface 1220 can be coated with a polarization selective coating. An adjustment system (not shown) can be used to adjust the position of prism 1205 to produce the desired magnification of the beam (e.g., in one direction).

FIG. 13 illustrates an optical system configuration using three prisms 1305, 1310, 1315 to alter the size of the beam in one direction compared to another direction. One or more of the proximal surfaces 1320, 1330, 1340 can be coated with a polarization selective coating to reflect the s-polarization component and transmit the p-polarization component. The near surfaces 1320, 1330, 1340 can be aligned such that the input laser beam has an angle of incidence at or near Brewster's angle, for example, within +/−2 degrees of Brewster's angle. One or more of the far surfaces 1325, 1335, 1345 can be coated with an anti-reflection material to maximize or increase the transmission of the beam out of the prisms. In some embodiments, the far surfaces 1325, 1335, 1345 can be coated with a polarization selective coating. The optical system in FIG. 13 can also include an adjustment system (not shown) to adjust the position or orientation of prisms 1305, 1310, 1315 to produce a desired magnification to transform the elliptical input beam to a circular beam.

FIG. 14 shows an optical system configuration using four prisms 1405, 1410, 1415, 1420 to alter the size of the beam in one direction compared to another direction. One or more of the near surfaces 1425, 1435, 1445, 1455 can be coated with a polarization selective coating to reflect the s-polarization component and transmit the p-polarization component. The near surfaces 1425, 1435, 1445, 1455 can be aligned such that the input laser beam has an angle of incidence at or near Brewster's angle, for example, within a range of +/−2 degrees of Brewster's angle. One or more of the far surfaces 1430, 1440, 1450, 1455 can be coated with an anti-reflection material to maximize or increase the transmission of the beam out of the prisms or in some embodiments, coated with a polarization selective coating. The optical system in FIG. 14 can also include an adjustment system (not shown) to adjust the position of prisms 1405, 1410, 1415, 1420 to produce a desired magnification to transform the elliptical input beam to a circular beam. Any of the anamorphic optical systems illustrated in FIGS. 12-14 can be included in a laser diode system, such as the one illustrated in FIG. 7, to produce a highly polarized circular beam from an elliptical beam. The different embodiments may be advantageous depending on the particular application. For example, the anamorphic optical system illustrated in FIG. 14 can produce an exit beam that is centered on the same optical axis as the input beam. In other applications, a single prism anamorphic optical system such as shown in FIG. 12 may be preferred for an application limited in size and not requiring the amount of magnification as can be available with multiple prism anamorphic systems. Also, in applications where cost is a major factor, an anamorphic system with fewer prisms can be preferred.

Figure 15:
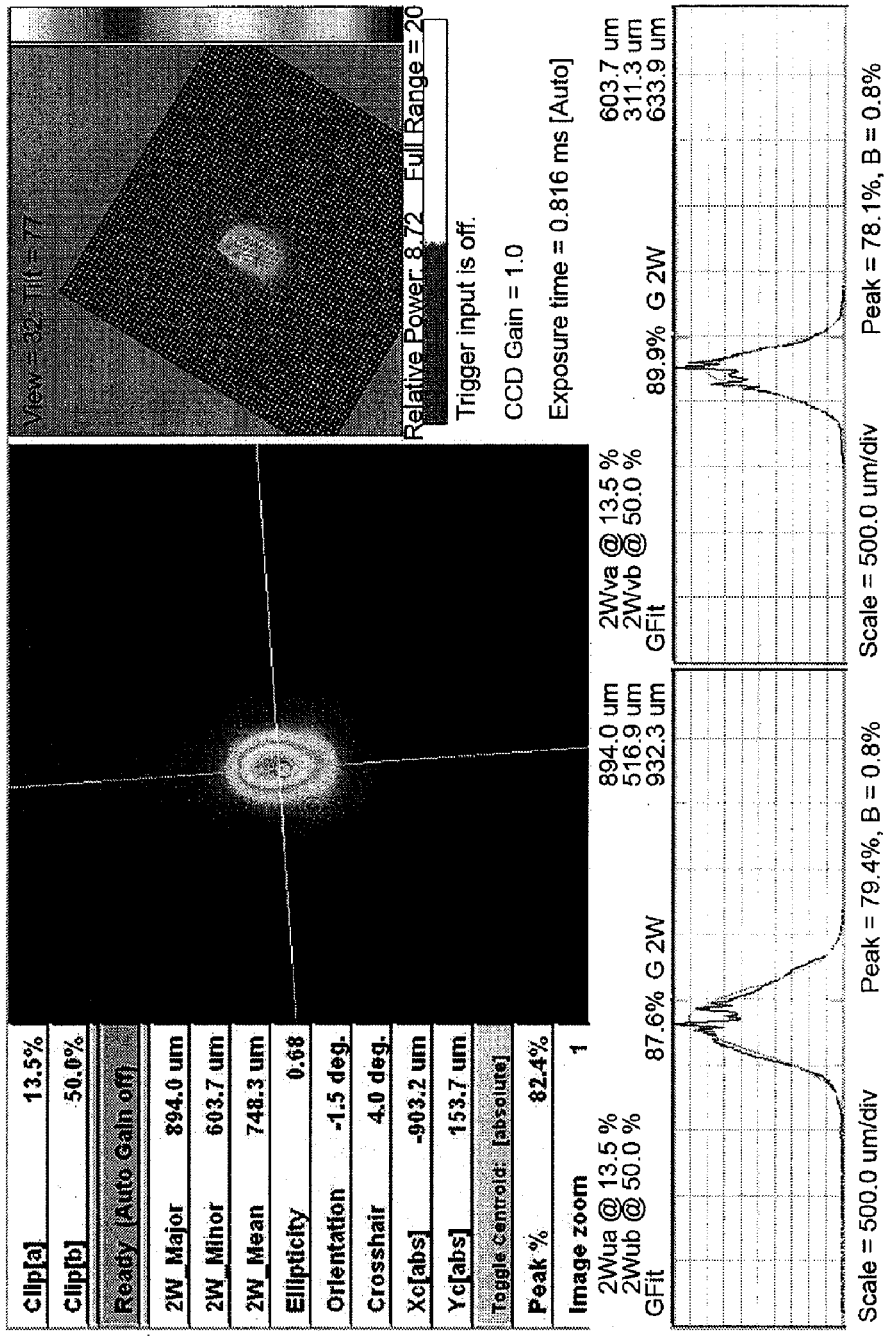
FIG. 15 shows an example of a waveguide laser beam collimated using a lens having a focal length of 3 mm.
Figure 16:
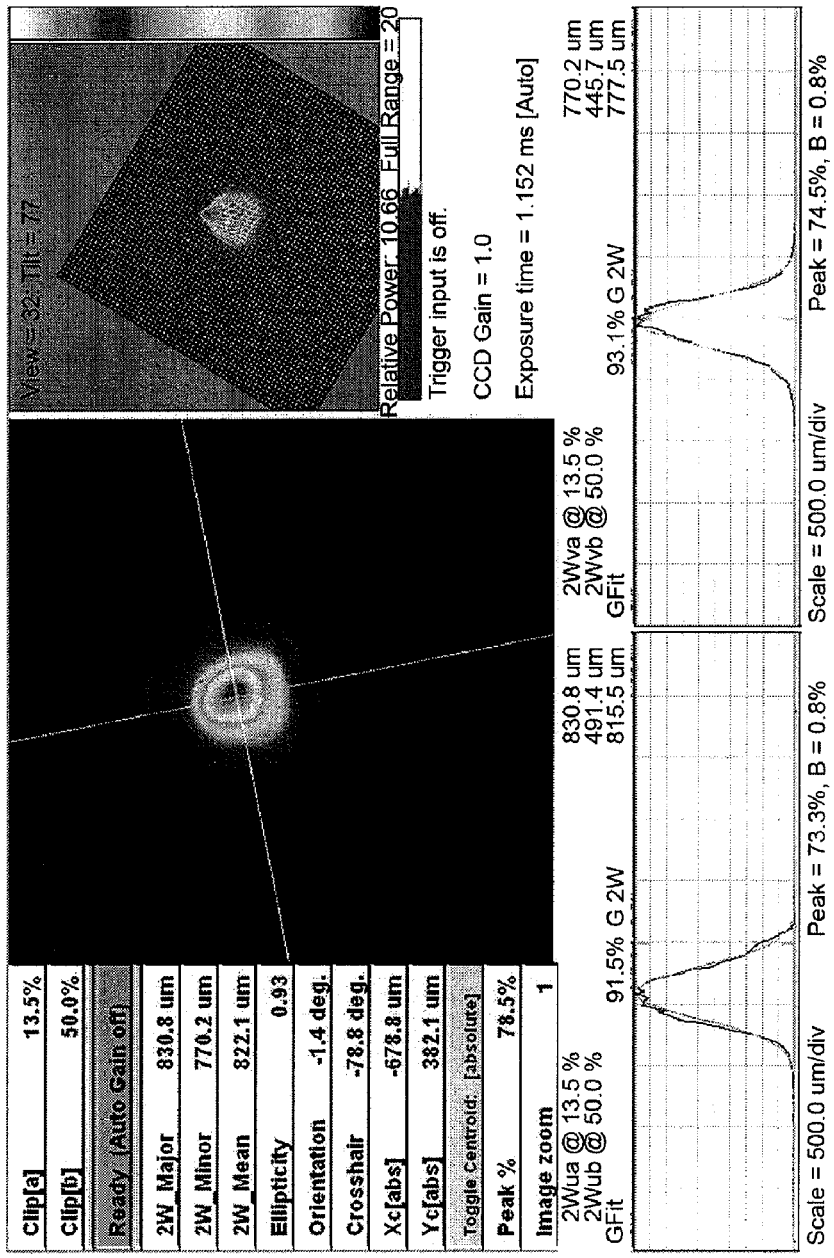
FIG. 16 shows the same waveguide laser beam as illustrated in FIG. 15, collimated using a lens having a focal length of 3 mm, where the beam also passes through a Brewster telescope where one of the near optical element surfaces is coated with a polarization selective material to improve the polarization ratio.

FIGS. 15 and 16 illustrate one example of a transformed beam shape and polarization ratio gain using a polarization selective coating on a near surface of a prism configured in a Brewster telescope, where the prism is aligned to receive an elliptical beam emitted from a diode laser. In FIG. 15, a waveguide beam was collimated using a lens with a focal length of 3 mm. The resulting beam is illustrated to have an ellipticity of 0.68. As used herein, ellipticity refers to the deviation or degree of deviation of an ellipse or ellipsoid from a perfect circle or sphere, and can be defined as the measured as the ratio of the minor axis to the major axis of the ellipse or ellipsoid. The resulting beam also has a polarization ratio of 6:1. In FIG. 16, the same waveguide beam was collimated again using a lens with a focal length of 3 mm, however, the beam also propagated through a Brewster telescope having a prism with an input surface coated with a polarization selective coating that reflects the s-polarization component and transmits the p-polarization component. As illustrated in FIG.

16, the resulting beam appears more circular in shape and has a measured ellipticity of 0.93, indicating that it is more circularly symmetrical than the beam illustrated in FIG. 15. The resulting beam shown in FIG. 16 has a polarization ratio of 636:1, which makes it more useful for applications requiring a high polarization ratio.

One example of a polarization selective coating that polarizes a beam by reflecting the s-polarization component and transmitting the p-polarization component is illustrated in tables of FIGS. 17 and 18, where FIG. 17 shows the transmission of the s-polarization component for a range of wavelengths and FIG. 18 shows the transmission of the p-polarization component for a range of wavelengths. As can be seen by this data, in the 480-490 nm range this polarization selective coating transmits only 0.13-2.2% of the s-polarization component, respectively, while allowing 95.29%-96.36% transmission of the p-polarization component, respectively. The polarization ratio is high, for example, at a wavelength of 488 nm, the coating allows transmission of only 0.94% of the s-polarization component while transmitting 97.05% of the p-polarization component. Depending on the application, a polarization selective coating can be selected that is optimized for the wavelength of the desired application.

Certain inventive aspects described herein have other beneficial applications in diode laser systems. For example, in some embodiments a portion of the laser beam is split off using a beam splitter (e.g., a 2% beam splitter) and the portion, or optical signal, is used by an automatic power control (APC) system to control operation of the laser. However, variations in the polarization of the laser beam can cause spurious fluctuations in the optical signal resulting in improper adjustments to the diode laser. To counter this effect, a diode laser system can include a polarizer to polarize the light from the diode laser beam prior to splitting off the optical signal. Accordingly, of the optical signal provided by the beam splitter represents an optical power level output by the system and not simply redistribution in optical energy from one polarization component to another polarization component.

Figure 19C:
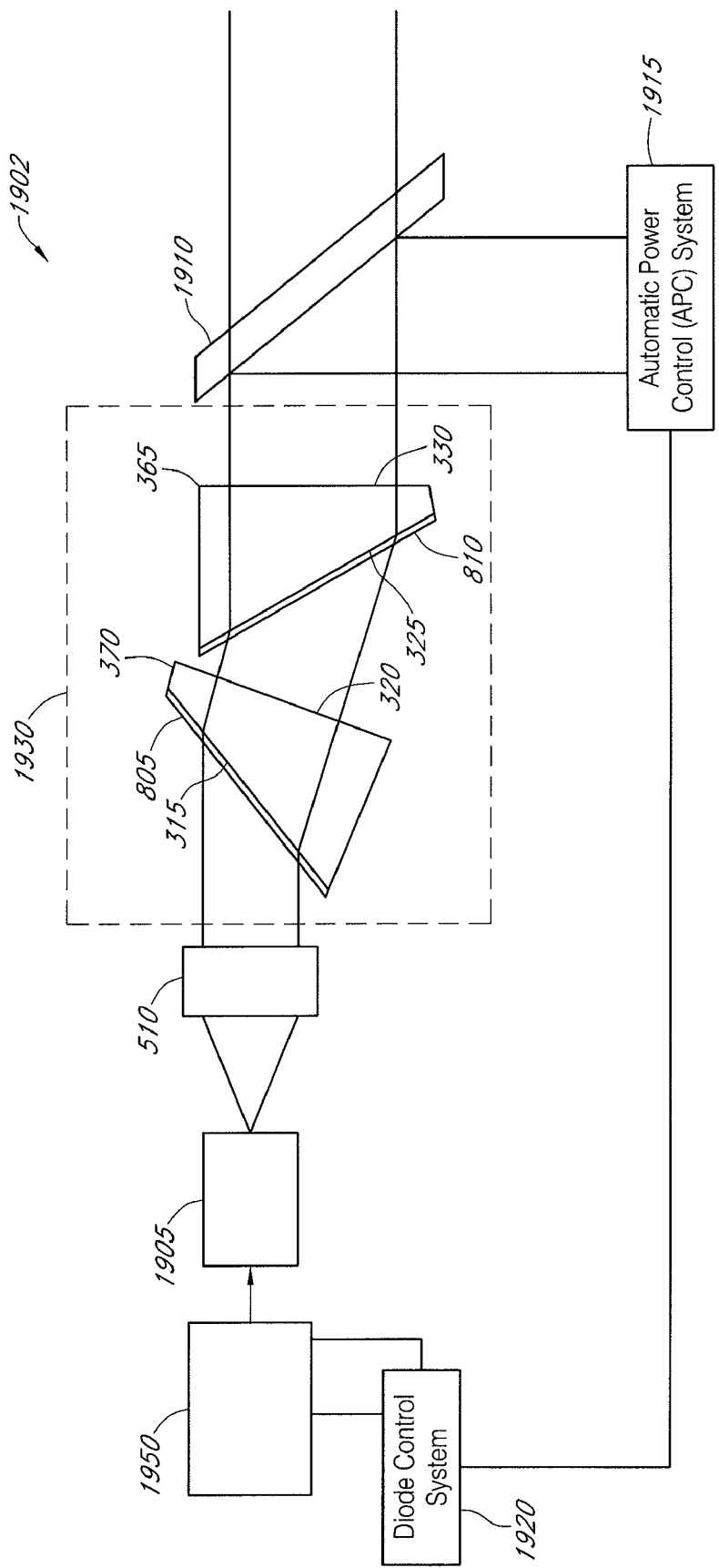
FIG. 19C is a diagram of a pump diode laser system that incorporates certain aspects of the invention.

FIGS. 19A, 19B, and 19C illustrate three examples of embodiments of frequency converted laser systems 1900, 1901, 1902, respectively, that include a polarizer 1930 positioned to polarize a light beam to have a high polarization ratio before it is used in an APC system 1915. In systems 1900, 1901, 1902 polarizer 1930 comprises an anamorphic system to transform an elliptical beam into a circular beam and to polarize the beam to have a high polarization ratio. However, in some embodiments, the polarizer 1930 can be another type of polarizer, for example, a film or a film stack, or one or more optical elements that does not comprise an anamorphic optical system. In such embodiments, an anamorphic system can be used to transform the shape of the beam after a portion of the beam is provided to the APC system.

As shown in FIGS. 19A and 19B, systems 1900, 1901 comprise a diode laser 505 that emits an elliptical shaped non-polarized laser beam at a fundamental wavelength (e.g., 976 nm). System 1902 in FIG. 19C comprises a pump diode 1950.

System 1900 (FIG. 19A) includes a collimator 510 which receives and collimates the elliptical shaped non-polarized laser beam emitted from diode laser 505. The collimated beam is then directed to a frequency converter 1905 (e.g., waveguide) to change the frequency (and wavelength) of the beam as required for a particular application. Frequency converter 1905 emits a converted beam which is directed to a polarizer 1930. In the embodiments shown in FIG. 19A-C, polarizer 1925 comprises an anamorphic system for polarization and transformation of the beam shape.

Referring now to FIG. 19B, system 1901 illustrates an alternative embodiment that includes an optical fiber 1925 coupled to the diode laser 505 such that it receives the elliptical and non-polarized beam emitted from diode laser 505. A fiber Bragg grating 1935, which selects, stabilizes and narrows the spectral linewidth of light from the diode 505, is formed in a portion of the optical fiber 1925. Light passing through the fiber Bragg grating 1935 is carried by the optical fiber 1925 to frequency converter 1905, which changes the frequency of the light (e.g., doubles the frequency and halves the wavelength). The frequency converter 1905 emits a converted beam of light to a collimator 510, which collimates the light and provides a collimated elliptical shaped beam of non-polarized light to a polarizer 1930. In FIG. 19C, system 1902 comprises a pump diode 1950 that provides a laser beam input to a waveguide 1905, which produces a converted frequency beam to collimator 510, which collimates the light and provides a collimated elliptical shaped beam of non-polarized light to a polarizer 1930.

The frequency converter 1905 in can comprise a nonlinear waveguide converter (e.g., a waveguide converter comprising a non-linear material) which are available in various configurations. In some embodiments, a waveguide converter comprises a frequency doubling nonlinear waveguide converter configured for second harmonic generation ("SHG") configured to receive a beam at 976 nm and provide a beam at 488 nm. The waveguide converter can comprise PPLN or another nonlinear material, such as PP:MgO:LN, PP:MgO:LT, PP:KTP, PP:SLN, and PP:SLT. Such waveguide converters can efficiently double the frequency, however, the fundamental frequency (of the input laser beam) must be within a narrow range of wavelengths. In various embodiments, to provide efficient frequency doubling in the nonlinear material, the fundamental wavelength of the input beam from the diode laser closely matches the design wavelength of the nonlinear material, and the spectral linewidth of the input beam is relatively narrow (i.e., substantially within a narrow range of frequencies), within or close to the spectral acceptance of the nonlinear process.

The frequency converter 1905 emits a laser beam converted in frequency, but still elliptically shaped and not highly polarized. Polarizer 1930 is positioned to receive the frequency converted beam, and can comprise one or more optical components (e.g., optical elements, filters, films, or coatings) to highly polarize the received beam. In some embodiments, the polarizer 1930 is an anamorphic system, for example, a set of prisms 370, 365 aligned to receive the beam from the collimator 510 at an angle of incidence at or near Brewster's angle, and transform the elliptical beam into a more circular beam, where each prism has an input surface and an exit surface, and where at least one of the input surfaces or exit surfaces is coated with a polarization selective coating. The coating comprises one or multiple layers (films) that affect polarization. In some embodiments, the coating comprises multiple quarter-wave or half-wave films. In some embodiments, the input surface of at least one of the prisms 370, 365 is positioned such that an angle of incidence of an input laser beam is within a range of about plus or minus two degrees of Brewster's angle. The position of the prisms 370, 365 can be changed using an adjustment system so that the prisms 370, 365 produce the desired exit beam shape. Polarization selective coatings 805, 810 reflect the s-polarization component and transmit the p-polarization component of the input beam so the exit beam is highly polarized. In some embodiments, the exit beam produced by the polarizer has a polarization ratio of 100:1 or greater, while in some embodiments the polarization ratio is 500:1 or higher.

Beam splitter 1910 is positioned to receive a highly polarized light beam from the polarizer 1930 and is configured to split off a portion of the beam and direct an optical signal to APC system 1915. The APC system 1915 is positioned to receive the optical signal and use it to control the output of the diode laser. For example, based on the optical signal the APC system 1915 interacts with diode control system 1920 to maintain a consistent spectral output emitted by the diode laser 505, for example, by adjusting the current supplied to the diode laser 505, so that the beam from the diode laser closely matches the design wavelength of the nonlinear material of the waveguide converter.

In a manner as described above, the polarizer 1930 effectively polarizes the laser beam thereby providing an output beam having a fixed polarization. The beam splitter 1910 will pull off a portion of this polarized beam. However, because the beam is highly polarized, fluctuations in the signal pulled off by the beam splitter represent variation in the overall output intensity level of the laser system 1900 and not simply redistribution of optical power from one polarization component to another. The feedback thus directly correlates with the output intensity of the laser system 1900. Accordingly, the APC system 1915 monitoring a highly polarized beam can control the output of the diode laser with greater accuracy, and can provide a more stable output power from the wavelength converter 510 for use in an application.

Using a polarizer to produce a highly polarized optical signal that is used to control one or more elements of a diode laser system is not limited to the above-described embodiment. As another example, the polarizer can be used in a diode laser system that also includes a temperature control system. In certain embodiments, a temperature control system monitors the diode current that is required to maintain constant laser output power. The temperature control system can be configured to adjust the temperature of a thermo-cooler attached to a waveguide converter to obtain the lowest possible diode current to produce a predetermined output. For example, when a large current increase (e.g., 10% or more) is detected, which means the efficiency of the laser system is reduced, the temperature control system changes the temperature of the XTEC. Ideally, the temperature adjustment will cause the diode laser system to operate more efficiently and the appropriate laser output power can be achieve without excessively driving the laser diode with large amounts of current. Some embodiments of such systems are described in U.S. Provisional Application No. 60/763,497, filed Jan. 30, 2006, titled "SYSTEM FOR REDUCING NOISE AND EFFICIENTLY OPERATING A STABILIZED FREQUENCY CONVERTED DIODE LASER," which is hereby incorporated by reference in its entirety.

One example of such a diode laser system (e.g., a Bragg grating stabilized diode laser at 976 nm) comprises a diode control system, a semiconductor gain medium (e.g., a laser diode without reflective facets that define a resonator cavity in the semiconductor structure), a high reflector which forms one end of the laser cavity, a diode thermo-electric cooler thermally connected to the gain medium, an optical fiber optically coupled to the gain medium, and a fiber Bragg grating in the optical fiber which forms the other end of the laser cavity. The diode laser system further comprises a waveguide converter (e.g., a periodically poled nonlinear waveguide configured to provide second harmonic generation) which is connected to the output of the optical fiber to receive an emitted laser beam, a thermo-electric cooler connected to the waveguide converter (XTEC) and a beam splitter positioned to receive a beam emitted from the waveguide converter and direct a portion of the emitted beam (referred to above as an "optical signal") to an APC system. By positioning a polarizer to polarize the laser beam emitted from the waveguide converter before the optical signal is split off by the beam splitter and provided to an APC system, a highly polarized optical signal devoid of polarization component variations is provided which allows for more accurate control.

The diode laser system can further comprises a temperature control system configured to receive information from the APC system about the beam output, as sensed in the optical signal. This temperature control system may also benefit from using the polarizer to polarize the laser beam before splitting off a portion for feedback. Polarizing the beam prior to the polarization beam splitter allows the APC system to sees a more accurate representation of the actual optical power output from laser system 1900. Redistribution of optical energy from one polarization component to another is less likely to be inaccurately perceived as total power variations in the output power of the laser system. Feedback information used to control the temperature is, thus, more accurate, which increases effectiveness of the temperature control system.

In addition, other control systems that utilize the optical signal pulled off by the polarization beam splitter to monitor system power output may also benefit from a highly polarized optical signal (feedback) because it provides a more accurate representation of actual power output. For example, in some embodiments, the temperature control system also monitors AC noise level in the optical signal. Excess noise indicates operational inefficiencies in the diode laser system. Accordingly, the presence of AC components in the optical signal may be monitored and the temperature of the XTEC can be adjusted to reduce or minimize the noise thereby increasing the efficiency of the laser system.

Controlling the temperature of one or more components of a frequency converted diode laser system can also be done by thermal coupling one component to another, and/or thermal coupling a component to a temperature controlled element. Some embodiments of such systems are described in U.S. Provisional Application No. 60/691,271, filed Jun. 15, 2005, titled "TEMPERATURE CONTROL SYSTEM FOR A FREQUENCY CONVERTED DIODE LASER," which is hereby incorporated by reference in its entirety.

In some embodiments of a frequency converted laser system, the laser input comprises a first and a second input laser beam. In one example, a frequency converted laser system comprises a waveguide comprising at least one nonlinear material. The waveguide can be configured to receive the first and second input laser beams and emit a non-circular shaped laser beam having a frequency different than either said first or second input laser beams. The system can also comprise an anamorphic optical system configured to input the non-circular shaped laser beam emitted from the waveguide, the anamorphic optical system comprising a first prism and a second prism configured to provide an anamorphic change to the shape of the beam input into the anamorphic optical system. The first prism and second prism each comprise an input surface and an exit surface, and at least one of the input or exit surfaces of the first or second prisms is coated with a polarization selective coating. In such a system, the anamorphic optical system is configured to transform said input non-circular shaped laser beam into a polarized output laser beam with an anamorphically changed beam shape. In some embodiments, the first and second input laser beams have the same frequency, while in other embodiments the first and second input laser beams have different frequencies.

Figure 20:
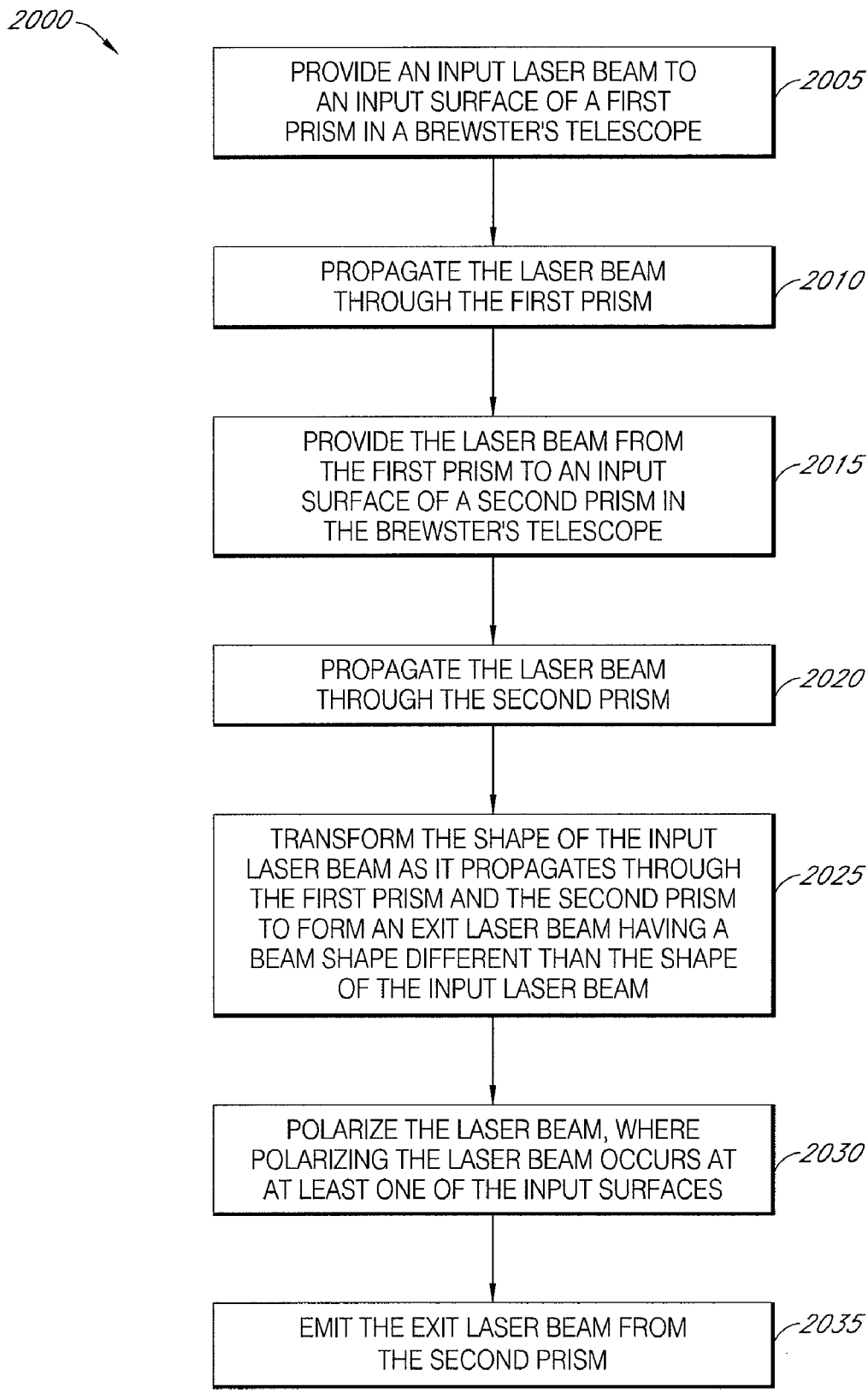
FIG. 20 is a flowchart of a process of transforming an elliptically-shaped beam from a diode laser to a more circularly-shaped beam.

FIG. 20 is a flowchart of a process 2000 for transforming an elliptically-shaped beam from a diode laser to a polarized and more circularly-shaped beam. Process 2000 begins at state 2005 where an elliptical-shaped input laser beam is provided to an input surface of a first prism in a Brewster's telescope. Such a beam can be provided by, for example, diode laser 505 shown in FIG. 7. One example of such a Brewster's telescope configuration is illustrated in the diode laser system 1900 shown in FIG. 19A. Process 2000 then proceeds to state 2010 where the input laser beam is propagated through the first prism.

In state 2015, process 2000 provides the input laser beam that propagated through the first prism to an input surface of a second prism in the Brewster's telescope. Process 2000 then proceeds to state 2020 where the laser beam propagates through the second prism in the Brewster's telescope configuration. Next, process 2000 proceeds to state 2025 where it transforms the shape of the input laser beam as it propagates through the first prism and the second prism to form an exit laser beam being more circularly symmetrical than the input laser beam. Next, process 2000 then proceeds to state 2030 and changes the polarization of the laser beam propagating through the first prism and the second prism to achieve a high polarization ratio. State 2030 can be accomplished by propagating the beam through a polarization selective coating on at least one of the surfaces of the first or second prism through which the beam propagates. In some embodiments, the polarization coating is designed to reflect a large percentage of the s-polarization component and allow transmission of a large percentage of the p-polarization component through the prism(s). A high polarization ratio can also be achieved, in part, by positioning the first and second prisms such that the beam propagating through the prisms has an angle of incident of the input surfaces of at or near Brewster's angle. Lastly, at state 2035 process 2000 emits an exit laser beam from the second prism for use in a laser application, the exit beam having a high polarization ratio and being shaped more circularly symmetrical than the input laser beam.

Various modifications to these examples may be readily apparent to those skilled in the art, and the generic principles defined herein may be applied to other examples without departing from the spirit or scope of the novel aspects described herein. Thus, the scope of the disclosure is not intended to be limited to the examples shown herein but is to be accorded the widest scope consistent with the principles and novel features disclosed herein. Accordingly, the novel aspects described herein is to be defined solely by the scope of the following claims.

The invention claimed is:

1. An optical system for transforming a non-circular laser beam from a laser to a polarized differently-shaped laser symmetric beam, comprising:
    a first optical component comprising a first input surface for receiving a laser beam and a first exit surface through which the laser beam is emitted; and
    a second optical component comprising a second input surface aligned to receive the laser beam emitted from the first optical component and a second exit surface through which the laser beam is emitted,
    wherein the first and second optical components are structured to transform a lateral dimension of the laser beam as it propagates through the first and second optical components so that the shape of the output laser beam emitted from the second optical component is more circularly symmetrical than the input laser beam,
    wherein at least one of the input and output surfaces of the first or second optical components is coated with a polarization selective coating, and
    wherein the configuration of the first optical component, the second optical component, and the polarization selective coating produce a polarization ratio of about 100:1 or higher for the output laser beam exiting the second optical component.

2. The optical system of claim 1, wherein at least one of the first input surface of the first optical component and the second input surface of the second optical component are positioned to receive the laser beam such that an angle of incidence of the laser beam received on the at least one of the first and second input surfaces is within a range of about plus or minus two degrees of Brewster's angle.

3. The optical system of claim 1, wherein the shape of the output laser beam emitted from the second exit surface of the second optical component is more circular than the shape of the input laser beam received on the first input surface of the first optical component.

4. The optical system of claim 1, wherein the shape of the output laser beam emitted from the second optical component is approximately circularly symmetrical.

5. The optical system of claim 1, wherein both the input surface of the first optical component and the input surface of the second optical component are coated with the polarization selective coating.

6. The optical system of claim 1, wherein the polarization selective coating is configured to reflect an s-polarization component of the laser beam and transmit a p-polarization component of the laser beam.

7. The optical system of claim 1, wherein the polarization selective coating is configured to reflect about 98% or more of a s-polarization component and transmit about 98% or more of a p-polarization component.

8. The optical system of claim 1, wherein the polarization selective coating is configured to reflect about 98% or more of a s-polarization component and transmit about 98% or more of a p-polarization component at wavelengths of between about 485 nm and 492 nm.

9. The optical system of claim 1, wherein the input surface of at least one of the first and second optical components is coated with the polarization selective coating, wherein said polarization selective coating is configured to transmit about 0.04% or less of a s-polarization component and transmit about 99.4% or more of a p-polarization component at a wavelength of about 488 nm.

10. The optical system of claim 1, further comprising an adjustment system configured to adjust the transformation of the shape of the laser beam by changing the position of at least one of the first and second optical components relative to the angle of incidence of the laser beam on the input surface of the at least one of the first and second optical components.

11. An apparatus for transforming an elliptical-shaped laser beam to a polarized substantially circular shaped beam, comprising:
    first means for introducing a first amount of prismatic deviation along a first direction of an input elliptical shaped laser beam received on an input surface of the first introducing means and emitted from an exit surface of the first introducing means;
    second means for introducing a second amount of prismatic deviation along said first direction of the laser beam emitted from the exit surface of the first means for introducing and received on an input surface of the second introducing means, wherein the second introducing means comprises an exit surface that emits the output laser beam; and means for polarizing the input laser beam such that the output laser beam has a polarization ratio of greater than 100:1, wherein at least some of the means for polarizing being disposed on said first or second prismatic deviation introducing means;

wherein the first and second amount of prismatic deviation transforms a lateral dimension of the input laser beam along said first direction to form the output laser beam that is more circularly symmetrical than the elliptical shaped input laser beam.

12. The apparatus of claim 11, wherein at least one of the first introducing means and the second introducing means are positioned such that an angle of incidence of the laser beam incident upon the at least one of the first and second introducing means is within a range of about plus or minus two degrees of Brewster's angle.

13. The apparatus of claim 11, wherein the shape of the laser beam output from the apparatus is more circular than the shape of the input laser beam incident upon the first introducing means.

14. The apparatus of claim 11, wherein the shape of the output laser beam emitted from the second introducing means is approximately circularly symmetrical.

15. The apparatus of claim 11, wherein both the input surface of the first introducing means and the input surface of the second introducing means are coated with the polarizing means.

16. The apparatus of claim 11, wherein the polarizing means is configured to reflect an s-polarization component of the laser beam and transmit a p-polarization component of the laser beam.

17. The apparatus of claim 11, wherein the polarizing means is configured to reflect about 98% or more of a s-polarization component and transmit about 98% or more of a p-polarization component.

18. The apparatus of claim 11, wherein the polarizing means is configured to reflect about 98% or more of a s-polarization component and transmit about 98% or more of a p-polarization component at wavelengths of between about 485 nm and 492 nm.

19. The apparatus of claim 11, wherein the input surface of at least one of the first and second introducing means is coated with the polarizing means, wherein said polarizing means is configured to transmit about 0.04% or less of a s-polarization component and transmit about 99.4% or more of a p-polarization component at a wavelength of about 488 nm.

20. The apparatus of claim 11, further comprising a means for adjusting configured to change the position of at least one of the first and second introducing means to adjust the transformation of the shape of the output laser beam.

* * * * *

UNITED STATES PATENT AND TRADEMARK OFFICE
CERTIFICATE OF CORRECTION

PATENT NO. : 7,869,133 B2  Page 1 of 1
APPLICATION NO. : 12/686178
DATED : January 11, 2011
INVENTOR(S) : O'Shaughnessy et al.

It is certified that error appears in the above-identified patent and that said Letters Patent is hereby corrected as shown below:

On Title Page (Item 75), Line 7, delete "N. Nutmeg," for Marc L. Shaffer and insert --N. Nutmeg St.,--, therefor.

In the drawings:
On Sheet 1 of 22 (FIG. 1D), Line 2, delete "machanical," and insert --mechanical--, therefor.

In Column 7, Line 13, after "below" insert --.--.

In Column 7, Line 64, after "applications" insert --.--.

In Column 11, Line 31, delete "The" and insert --the--, therefor.

In Column 15, Line 67, delete "FIG." and insert --FIGS.--, therefor.

Signed and Sealed this
Twenty-sixth Day of July, 2011

David J. Kappos
*Director of the United States Patent and Trademark Office*